(12) United States Patent
Affentauschegg et al.

(10) Patent No.: US 10,324,379 B2
(45) Date of Patent: Jun. 18, 2019

(54) LITHOGRAPHIC APPARATUS AND METHOD

(71) Applicant: ASML Netherlands B.V., Veldhoven (NL)

(72) Inventors: Cedric Marc Affentauschegg, Leende (NL); Milenko Jovanovic, Eindhoven (NL); Richard Johannes Franciscus Van Haren, Waalre (NL); Reiner Maria Jungblut, Eindhoven (NL); Robertus Wilhelmus Van Der Heijden, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/737,400

(22) PCT Filed: Jun. 7, 2016

(86) PCT No.: PCT/EP2016/062842
§ 371 (c)(1),
(2) Date: Dec. 18, 2017

(87) PCT Pub. No.: WO2016/206965
PCT Pub. Date: Dec. 29, 2016

(65) Prior Publication Data
US 2018/0173099 A1    Jun. 21, 2018

(30) Foreign Application Priority Data
Jun. 23, 2015  (EP) ..................................... 15173360

(51) Int. Cl.
*G03B 27/68*   (2006.01)
*G03F 7/20*    (2006.01)

(52) U.S. Cl.
CPC ............ *G03F 7/706* (2013.01); *G03F 7/7055* (2013.01); *G03F 7/70258* (2013.01);
(Continued)

(58) Field of Classification Search
CPC ............ G01M 11/0242; G03F 7/70591; G03F 7/706; G03F 7/70616–7/70641;
(Continued)

(56) References Cited

U.S. PATENT DOCUMENTS

2003/0018406 A1   1/2003   Yoshitake et al.
2004/0156030 A1   8/2004   Hansen
(Continued)

FOREIGN PATENT DOCUMENTS

CN   102736440 A   10/2012
EP   0997782 A1    5/2000
(Continued)

OTHER PUBLICATIONS

International Search Report and Written Opinion of the International Searching Authority directed to related International Application No. PCT/EP2016/062842, dated Oct. 14, 2016; 12 pages.
(Continued)

*Primary Examiner* — Christina A Riddle
(74) *Attorney, Agent, or Firm* — Sterne, Kessler, Goldstein & Fox P.L.L.C.

(57) ABSTRACT

A method to form on a substrate a first target comprising a first feature and a second target comprising a second feature, wherein the forming of the targets comprises applying the first feature and the second feature to the substrate by projection of a radiation beam through a production patterning device installed in a lithographic apparatus, the features corresponding to one or more features of the patterning device, and controlling a configuration of the lithographic apparatus to induce an aberration component, such that the
(Continued)

first feature is applied to the substrate using a first value of an induced aberration component and the second feature is applied to the substrate using a second, different value of the induced aberration component; measuring a property of the targets; and using the measurements to determine a sensitivity of the property of the targets to changes in value of the induced aberration component.

14 Claims, 9 Drawing Sheets

(52) U.S. Cl.
CPC ...... *G03F 7/70266* (2013.01); *G03F 7/70633* (2013.01); *G03F 7/70683* (2013.01)

(58) Field of Classification Search
CPC ........ G03F 7/70666–7/70683; G03F 7/70258; G03F 7/70266; G03F 7/70008; G03F 7/7055; G03F 7/70633
USPC ......... 355/52, 53, 55, 67–71, 77; 250/492.1, 250/492.2, 492.22
See application file for complete search history.

(56) References Cited

U.S. PATENT DOCUMENTS

| | | | |
|---|---|---|---|
| 2005/0010878 A1 | | 1/2005 | Blatchford, Jr. et al. |
| 2006/0114437 A1* | | 6/2006 | Akhssay ............ G03F 7/70258 355/55 |
| 2006/0126046 A1 | | 6/2006 | Hansen |
| 2006/0169927 A1 | | 8/2006 | Muraki et al. |
| 2006/0256322 A1* | | 11/2006 | Bowes .................... G03F 7/706 356/124 |
| 2011/0028004 A1 | | 2/2011 | Wang et al. |
| 2012/0257182 A1 | | 10/2012 | Zhang et al. |
| 2014/0313499 A1 | | 10/2014 | Fukagawa et al. |
| 2014/0327892 A1 | | 11/2014 | Walter et al. |
| 2015/0186581 A1 | | 7/2015 | Chen et al. |
| 2016/0291481 A1 | | 10/2016 | Smilde et al. |

FOREIGN PATENT DOCUMENTS

| | | | |
|---|---|---|---|
| JP | 2000-133576 A | | 5/2000 |
| JP | 2003-031477 A | | 1/2003 |
| JP | 2004-247737 A | | 9/2004 |
| JP | 2005-033205 A | | 2/2005 |
| JP | 2006-210503 A | | 8/2006 |
| JP | 2010-251462 A | | 11/2010 |
| JP | 2013-500597 T | | 1/2013 |
| JP | 2014-022613 A | | 2/2014 |
| JP | 2014-103343 A | | 6/2014 |
| JP | 2015-510694 T | | 4/2015 |
| TW | 201523168 A | | 6/2015 |
| WO | WO-2014/039689 A1 | | 3/2014 |
| WO | WO-2015/101458 A1 | | 7/2015 |

OTHER PUBLICATIONS

International Preliminary Report on Patentability directed to related International Application No. PCT/EP2016/062842, dated Dec. 26, 2017; 9 pages.

Kempsell Sears et al., "Pupil wavefront manipulation for optical nanolithography," *Proceedings of SPIE*, vol. 8326, Mar. 13, 2012, Bellingham, WA; pp. 1-10.

Chen et al., "Improving on-product performance at litho using integrated diffraction-based metrology and computationally designed device-like targets fit for advanced technologies (incl. FinFET)," *Proceedings of SPIE*, vol. 9050, Apr. 2, 2014, Bellingham, WA; pp. 1-10.

Kang et al., "Solution for high-order distortion on extreme illumination condition using computational prediction method;" Proceedings of SPIE, vol. 9426, Mar. 18, 2015, Bellingham, WA; pp. 1-10.

\* cited by examiner

LITHOGRAPHIC APPARATUS AND METHOD

CROSS-REFERENCE TO RELATED APPLICATIONS

This application claims priority of EP application 15173360.7 which was filed on 23 Jun. 2015 and which is incorporated herein in its entirety by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

In addition to generating a desired circuit pattern, the patterning device may be used to generate metrology targets on the target portion of the substrate. A metrology target may be a feature or set of features that is applied to the substrate for the purpose of metrology, for example to facilitate determination of measures of overlay or focus quality.

In order to ensure that pattern features applied to a substrate are applied as intended (e.g. to ensure that critical dimension limits, requirements, or uniformities are met and/or to ensure that overlay requirements are met), it may be desirable to at least partially correct for optical aberrations in the lithographic apparatus. The determination and control of optical aberrations may be important for improving lithographic performance. As overlay performance is becoming more demanding, lens aberrations may be becoming a limiting factor to performance in some circumstances.

Aberrations may arise due to heating of one or more elements of a projection system of the lithographic apparatus due to the transmission or reflection of at least a portion of a radiation beam, and this heating may cause distortion or the like of those one or more elements. Alternatively and/or additionally, aberrations may arise for one or more other reasons, for example optical surfaces not performing in accordance with theory.

Aberrations may not only affect the overlay of device features directly by pattern shift, but may also affect the accuracy of metrology targets due to mismatched sensitivities with the device features. A metrology target may be used to measure overlay on the assumption that the measured overlay of the metrology target is representative of the overlay of a device in the neighbourhood of that metrology target. If the metrology target is more or less sensitive to a particular aberration than the device itself, then the overlay measured on the metrology target may differ from the overlay present in the device. A correction applied by an APC (advanced or automated process control) in response to a measured metrology target overlay may reduce the metrology target overlay, but add an overlay error to the device. This may force customers to include offsets in their process control loop to correct for the difference so that the device overlay is properly corrected. Such offsets may correct the mismatch between metrology overlay and device overlay.

The impact of different types and magnitudes of aberrations is application specific. How a specific application (e.g. an application of a pattern to a substrate) responds to a certain aberration may be defined as aberration sensitivity. Aberration sensitivity may depend on one or more of a number of factors, for example an illumination mode used by the lithographic apparatus, one or more properties of a pattern feature to be applied to a substrate, one or more features of the substrate itself (for example, the composition or like of resist), the quality or configuration of the patterning device, and a dose of radiation provided in any given exposure.

Since aberration sensitivity is an important factor that needs to be taken into account when applying patterns to a substrate, there have been attempts to determine aberration sensitivity of such patterns. One approach to determining aberration sensitivity is to construct a model or simulation which allows sensitivity to be determined in a theoretical model.

Some experimental methods are also known. In an example of a known experimental method, pattern features are applied to each of a number of target portions of a wafer (which may be different fields of a wafer) in turn. Amongst possible methods, lens heating feed-forward is used to induce an aberration and to gradually increase the magnitude of the aberration as the exposure progresses, such that target portions of the substrate that are exposed first are exposed with low magnitudes of the aberration, and target portions of the substrate that are exposed subsequently are exposed with successively higher magnitudes of the aberration. Once the pattern features have been exposed and appropriately processed, one or more properties of the pattern features of the target portions are measured, for example a sharpness of a pattern feature, a dimension of a pattern feature, or a shape of a pattern feature. The measurements from different target portions (corresponding to different magnitudes of the aberration) are used to determine a sensitivity of the property or properties of the pattern features to changes in the magnitude of the aberration.

In order to get a good signal to noise ratio, it may be required to measure a large number of data points on the wafer and correlate the induced aberrations with a measured property or properties, for example overlay. When exposing a wafer in a standard fashion with lens heating feedforward used to induce aberrations, it may only be possible to get a single sensitivity (that is, the sensitivity of a single property to a single aberration component, for example a single Zernike coefficient) measured from that wafer in order to get a good signal to noise ratio. Multiple sensitivities may be determined by exposing successive wafers, each with a different aberration.

The time needed to get an overlay measurement may be large since the number of pattern features used for the measurement may be high. In lens-heating feedforward, a Zernike offset is gradually increased. In order to determine sensitivities, multiple points may be needed so that a linear relation between overlay and aberration may be determined. Having more points may make the relation more accurate.

Measuring multiple sensitivities may in some circumstances require a large wafer cost and fab usage for the customer.

SUMMARY

According to an aspect of the invention, there is provided a method comprising: using a lithographic apparatus to form on a substrate a first target comprising a first feature and a second target comprising a second feature; wherein the forming of the targets comprises: applying the first feature and the second feature to the substrate by projection of a radiation beam through a patterning device installed in the lithographic apparatus, the features corresponding to one or more of the patterning device, and controlling a configuration of the lithographic apparatus to induce an aberration, such that the first feature is applied to the substrate using a first value of an induced aberration component and the second feature is applied to the substrate using a second, different value of the induced aberration component; measuring a property of the first target and of the second target; and using the measurements to determine a sensitivity of the property of the targets to changes in value of the induced aberration component. The patterning device may be a production patterning device.

By controlling a configuration of the lithographic apparatus to induce different values of an aberration component for different targets (for example, metrology overlay targets), a measured property of the targets (for example, overlay) may be compared for the different values of the aberration component, and a difference in that property may be used in determining a sensitivity of the property of the targets to the aberration component. The sensitivity that is measured is specific to the targets.

A lithographic apparatus may exhibit an intrinsic aberration, which may be manifested as a difference between desired characteristics of the radiation beam and the actual characteristics of the radiation beam that occur during production. For example, an optical element of the apparatus such as a lens may experience non-uniform heating during a production process, which may change the optical path length in some parts of the optical element when compared with other parts. Such aberrations may cause distortions in an image projected on the substrate. Such aberrations may be described as inherent to the lithographic apparatus.

An aberration that is induced may be an aberration that is deliberately added, in addition to any intrinsic aberration. Inducing an aberration may comprise increasing a magnitude of an aberration component above an intrinsic or residual magnitude of that aberration component. By deliberately adding an aberration component, different values of the aberration component may be introduced in a controlled manner and the effects of the aberration component may be determined.

The first and second targets may be of the same type of target. Determining a sensitivity of a property (for example, overlay) of the targets may comprise determining a sensitivity of a property of the type of target. Each target may, for example, comprise, represent or form part of a device or circuit component. Each target may comprise a metrology target. For example, the targets may be micro-diffraction based overlay (μDBO) targets and the determination of the sensitivity may comprise determining an overlay sensitivity of the μDBO targets.

Third, fourth, fifth and/or subsequent targets may also be used in the determination of the sensitivity, with features of the third, fourth, fifth and/or subsequent targets being applied with further, different values of the induced aberration component. Additionally and/or alternatively, for each value of the induced aberration component, a plurality of targets may be formed, and measurements for the plurality of targets may be used in the determination of the sensitivity.

The first target may comprise a first metrology target. The second target may comprise a second metrology target. The one or more patterning device features may comprise one or more production metrology markers.

The patterning device may further comprise patterning features for forming desired lithographic features on the substrate by projection of the radiation beam through the lithographic patterning device by the lithographic apparatus. Each desired lithographic feature may, for example, comprise, represent or form part of a device or circuit component.

The first target may comprise a first desired lithographic feature and the second target may comprise a second desired lithographic feature.

The patterning device may comprise a production reticle on which production metrology markers and patterning features are arranged such as to form a desired layout of metrology targets and desired lithographic features on a wafer in a production manufacturing process.

At least one of an illumination condition, an exposure condition and a processing condition may be the same as is used in the production manufacturing process. The substrate may be a wafer. The wafer may be processed through the manufacturing line.

By using production metrology markers of the production reticle to form the same type of metrology target as is used in production, a sensitivity determined for the type of metrology target by the method may be representative of an actual sensitivity of that type of metrology target as it is measured in production, for example on a production metrology tool. The determined sensitivity may take into account conditions that contribute to the sensitivity of the property in production, for example the effect on features of the metrology target of developing and/or processing.

The patterning device may be a customer's production reticle that is used in production of a particular wafer. The patterning device may have the customer's layout of production metrology markers and patterning features. The illumination conditions, processing conditions and/or other conditions of exposure, processing or measurement of features on the substrate may be the same as those used in production by the customer.

Applying the features to the substrate may comprise applying the features to a first lithographic layer. The substrate to which the features are applied may be a substrate that already contains multiple processed layers. The first lithographic layer may be any layer of a multi-layer structure.

Applying each feature to the substrate may comprise forming the features on the substrate by physical modification of the substrate due to projection of an image of one of the one or more patterning device features on the substrate by projection of radiation through the patterning device by the lithographic apparatus. The physical modification of the substrate may comprise modification of at least one property of the substrate, for example a modification of a structural or chemical property of the substrate. The determining of the at least one property of the targets may be performed after an expose step and/or after an etching step of a lithographic process that forms said at least one desired lithographic feature on the substrate.

The first feature and second feature may correspond to the same patterning device feature, or to different patterning device features of the same type. The first feature and second feature may correspond to the same production metrology marker, or to different production metrology markers of the same type. The first feature and second feature may correspond to the same patterning feature, or to different patterning features of the same type.

The method may further comprise forming further targets on the substrate, wherein features of the further targets are applied using first and second values of a further, different induced aberration component; measuring a property of the further targets; and using the measurements of the further targets to determine a sensitivity of a property of the further targets to changes in the further induced aberration component.

The first, second and further targets may be of the same type of target, corresponding to the same production metrology marker or type of production metrology marker or to the same patterning feature or type of patterning feature, such that the determined sensitivities to changes in the induced aberration and in the further induced aberration are sensitivities of the said same type of target.

The first and second targets may be formed on a first target portion, and the further targets formed on a second target portion.

Sensitivity of a property (for example, overlay) of a type of target to more than one aberration component may be determined. Sensitivities of the property to different aberration components may be determined on the same substrate. Different aberration components may be applied to different fields of the same wafer. Determining sensitivity of a property to multiple aberrations on the same substrate may reduce the number of individual targets required and/or may reduce the number of substrates required and/or may reduce the total time needed to determine the sensitivities, when compared to determining a single sensitivity per substrate.

The values of the induced aberration may comprise magnitudes of an aberration component. The values of the induced aberration may be quantifiable.

The inducing of the aberration component may comprise inducing a non-zero value or values of a selected Zernike coefficient. The inducing of the aberration component may comprise increasing a value of a selected Zernike coefficient above an intrinsic value of that Zernike coefficient. Zernike coefficients may be coefficients of Zernike polynomials used to describe aberrations, and inducing an aberration component may comprise changing the value of at least one Zernike coefficient, for example changing an induced value of a Zernike coefficient from zero to a positive value. Inducing an aberration component may comprise increasing the magnitude of a selected Zernike coefficient.

The induced aberration component may be a component represented by a selected Zernike coefficient. The further induced aberration component may be a component represented by a further, different selected Zernike coefficient.

The value or values of the selected Zernike coefficient may be induced in a projection system of the lithographic apparatus.

The selected Zernike coefficient may be a single Zernike coefficient, and the Zernike coefficient may be induced alone, with substantially no other Zernike coefficients being induced at the same time as the selected Zernike coefficient.

The inducing of the aberration may comprise inducing a non-zero value or values of a selected Zernike coefficient, and inducing the further aberration may comprise inducing a non-zero value or values of a further, different Zernike coefficient. The selected Zernike coefficient and the further, different Zernike coefficient may be induced independently. The selected Zernike coefficient and the further, different Zernike coefficient may be induced for different target portions.

In some circumstances, the inducing of a selected Zernike coefficient may result in the inducing of other, parasitic Zernike coefficients. Increasing a magnitude of a particular Zernike coefficient may result in the magnitude of other Zernike coefficients also being increased. Determining the sensitivity may comprise determining and substantially removing the effects of the other, parasitic Zernike coefficients.

For a plurality of target portions, a different aberration component may be induced in each of the target portions. Sensitivity of the targets to a plurality of different aberration components may be determined from a single substrate.

The method may comprise inducing a plurality of different aberration components each in a different one of a plurality of target portions of the substrate, each aberration component being represented by a different Zernike coefficient. The different aberration components may be induced at successive times and/or for different target portions. An order in which the aberration components are induced may be selected to minimize at least one transition time between the inducing of different aberration components. An order in which Zernike coefficients are induced may be selected to minimize at least one transition time between the inducing of different Zernike coefficients. A transition from a first Zernike coefficient to a second Zernike coefficient may comprise setting the first Zernike coefficient substantially to zero.

The first target and second target may be formed within the same target portion of the substrate. A plurality of targets may be formed within any one target portion of the substrate. The target portion may be a field. The substrate may contain a plurality of fields that are successively patterned.

Controlling a configuration of the lithographic apparatus to induce an aberration may comprise controlling a configuration of the lithographic apparatus to induce a variation of the value of the aberration component with position across the target portion, where the first target and second target are formed within the target portion.

The variation in the value of the aberration component may comprise a change in magnitude of an aberration component with position across the target portion, e.g. the field. By inducing a variation in the value of the aberration component with position across a single target portion, different targets within the target portion may be applied using different values for the aberration component. Applying different targets in a single target portion using different values for the aberration component may reduce the number of targets required to determine a sensitivity and/or may reduce the number of target portions required to determine the sensitivity and/or may reduce the time required to determine the sensitivity.

Inducing the variation in the magnitude of the aberration component may comprise inducing a change in magnitude of a selected Zernike coefficient with position across the target portion. The change in magnitude of the Zernike coefficient with position may be referred to as a Zernike tilt. The selected Zernike tilt may be induced for a given target portion with substantially no other Zernike coefficient being induced for that target portion.

The sensitivity of the property of the targets may be determined by comparing a difference in measurements of the property between different targets to a difference in the value of the induced aberration for the different targets. For example, a sensitivity may be obtained by dividing a measured difference in overlay by an induced difference in the value of an aberration component.

The first feature, which is of the first target, may be applied to a first lithographic layer. The second feature, which is of the second target, may be applied to the same first lithographic layer. The first target may further include a further feature applied to a second lithographic layer. The second target may further include a further feature applied to the same second lithographic layer.

The further features may be applied to the second lithographic layer substantially without any induced aberration.

The method may comprise etching and/or developing the first lithographic layer before applying the further features to the second lithographic layer. The method may comprise etching and/or developing the second lithographic layer before applying the features to the first lithographic layer.

The sensitivity may comprise a post-process sensitivity or an in-resist sensitivity.

The property of the targets may comprise an overlay property.

The overlay property of each target may comprise an overlay of features of the target applied to first and second lithographic layers.

For the first target, the property of the target may comprise an overlay of the first feature applied to the first lithographic layer and the further feature applied to the second lithographic layer. For the second target, the property of the target may comprise an overlay of the second feature applied to the first lithographic layer and the further feature applied to the second lithographic layer.

Each target may comprise at least one of: an overlay metrology target, a diffraction-based overlay target, a box-in-box target. The one or more patterning device features may comprise at least one of an intra-field overlay marker, a diffraction-based metrology marker.

The one or more patterning device features may comprise at least one production metrology marker. The production metrology marker may comprise at least one grating. The production metrology marker may comprise a plurality of gratings, wherein at least one of the gratings extends in a first direction and at least one other of the gratings extends in a second, different direction. There may be an offset of phase between at least one of the gratings of the production metrology marker and at least one other of the gratings of the production metrology marker. The production metrology marker may comprise features that are not gratings.

By using production metrology markers and metrology targets that are the same as those used in production, overlay measurements may be obtained that are representative of the overlay occurring in production.

The controlling of the configuration of the lithographic apparatus may comprise moving or deforming one or more elements of a lens arrangement of the lithographic apparatus, or heating one or more portions of the lithographic apparatus.

The controlling of the configuration of the lithographic apparatus may comprise locally changing an optical path length of the radiation beam using an array of optical elements arranged transverse to the radiation beam, each optical element comprising an individually addressable heating device.

The lithographic apparatus may comprise one or more components that, in use in normal production processes, may be used to compensate for intrinsic aberrations. Such systems may also be used to induce aberrations, for example by changing the optical path length of a part of the radiation beam relative to other parts of the radiation beam.

The configuration of the lithographic apparatus may be different for different target portions. The configuration of the lithographic apparatus for each target portion of the substrate may be selected, for example selected by a user. Aberrations may be added to a customer's exposure recipe.

The method may further comprise forming at least one reference target, wherein the at least one reference target is formed substantially without said induced aberration.

Reference targets may be formed without deliberately applying any changes to the optical apparatus. Reference targets may be formed with conditions, for example illumination conditions and exposure conditions, that are substantially as used in production. Therefore any aberration present during the formation of a reference target may comprise only intrinsic aberrations, and may not include any aberrations that are deliberately generated.

The method may further comprise measuring the property of the at least one reference target; using the measurement of the property of the at least one reference target to determine an aberration in the absence of said induced aberration; and using the determined aberration in the determination of the sensitivity of the property of the first and second targets.

At least part of each of the reference targets may be formed before the first and second targets are formed.

By forming reference targets without the induced aberration, it may be possible to remove the effects of any existing, intrinsic aberration in the projection system from the measurements. The existing aberration may be an aberration that may occur in normal production under normal production conditions. The existing aberration may be inherent to the lithographic apparatus and/or to the conditions under which the substrate is exposed and/or processed, for example exposure conditions or illumination conditions. Once the existing aberration is removed, remaining changes in the property may be due to the induced aberration component, which is the additional aberration component that has been deliberately generated. Measurements of the sensitivity of the property to the induced aberration component may be corrected by removing effects of existing aberrations that would still occur in the absence of the induced aberration.

The first and second targets may be of a first type of metrology target, and the method may further comprise forming metrology targets of a second type of metrology target, wherein features of the metrology targets of the second type are applied using differing values of the induced aberration component. The method may further comprise measuring a property of the metrology targets of the second type and using the measurements of the property to determine a sensitivity of the property of the metrology targets of the second type to changes in the induced aberration component. The method may further comprise comparing a sensitivity of the first type of metrology target to a sensitivity of the second type of metrology target.

The method may further comprise selecting or modifying the first type of metrology target or the second type of metrology target based on the comparing.

The sensitivities of different types of metrology target may be compared on a single substrate. The determined sensitivities may be used in selecting a metrology target, for example selecting which metrology target has the most appropriate sensitivity for use in production. The sensitivities of the different metrology targets may be representative of the sensitivities that they would exhibit in production conditions, for example including effects of developing and/or processing and or the effects of particular illumination conditions or exposure conditions that may be used in production. In some circumstances, for example if the sensitivity of a type of metrology target is determined to be inappropriate for its use in production, the design of that type of metrology target may be modified.

The method may further comprise modifying a method of measuring the property of the targets based on the determined sensitivity. For example, in a case in which the targets are metrology targets, a method of measurement for the metrology targets may be changed to result in a determined sensitivity that is similar to the determined sensitivity of a desired lithographic feature. For example, settings of a metrology tool may be changed. A frequency of radiation used by the metrology tool may be changed.

The first and second targets may be metrology targets, and the method may further comprise determining the sensitivity of a property of a desired lithographic feature to changes in the value of the induced aberration component. The method may further comprise comparing the determined sensitivity of the property of the metrology targets to the determined sensitivity of the property of the desired lithographic feature, thereby to determine an extent to which the sensitivity of the metrology targets is representative of the desired lithographic feature.

According to an aspect of the invention, there is provided a method comprising: providing a substrate, providing a beam of radiation using an illumination system, using a patterning device to impart the radiation beam with a pattern in its cross-section, and projecting the patterned radiation beam onto target portions of the substrate; wherein the projecting of the radiation beam onto target portions of the substrate comprises forming on the substrate a first target comprising a first feature and a second target comprising a second feature; wherein the forming of the targets comprises: applying the first feature and the second feature to the substrate by projection of the radiation beam through the patterning device, the features corresponding to one or more patterning device features of the patterning device, and controlling a configuration of the lithographic apparatus to induce an aberration, such that the first feature is applied to the substrate using a first value of an induced aberration component and the second feature is applied to the substrate using a second, different value of the induced aberration component; the method further comprising measuring a property of the first target and of the second target and using the measurements to determine a sensitivity of the property of the targets to changes in value of the induced aberration component.

According to a further aspect of the invention, there is provided a lithographic apparatus comprising: an illumination system for providing a beam of radiation; a support structure for supporting a patterning device, the patterning device serving to impart the radiation beam with a pattern in its cross-section; a projection system for projecting the patterned radiation beam onto target portions of the substrate; and a processing resource; wherein the lithographic apparatus is configured to form on the substrate a first target comprising a first feature and a second target comprising a second feature, the forming of the targets comprising: applying the first feature and the second feature to the substrate by projection of the radiation beam through the patterning device, the features corresponding to one or more patterning device features of the patterning device, and controlling a configuration of the lithographic apparatus to induce an aberration, such that the first feature is applied to the substrate using a first value of an induced aberration component and the second feature is applied to the substrate using a second, different value of the induced aberration component; and wherein the processing resource is configured to use measurements of a property of the first target and of the second target to determine a sensitivity of the property of the metrology targets to changes in value of the induced aberration component. The patterning device may comprise a production patterning device.

Controlling a configuration of the lithographic apparatus may comprise controlling a configuration of the projection system.

According to a further aspect of the invention, there is provided a method comprising using a lithographic apparatus to form a target or device on a substrate; performing at least one measurement to determine a value of an aberration that is present during the forming of the target or device; obtaining a sensitivity of a property of the target or device to the aberration; and predicting a value of the property of the target or device in dependence on the at least one measurement and on the sensitivity. The aberration may be an aberration of the lithographic apparatus.

By using a measured value of an aberration that is present during the forming of the target or device, a more accurate prediction of the property may be obtained. The measured value may be a measured value for an individual exposure.

The property may comprise at least one of pattern shift and overlay. The obtaining of the sensitivity may be based on a previous measurement of at least one target or device.

The value of the aberration may comprise a value of an aberration for an individual exposure.

The obtaining of the sensitivity may comprise using a lithographic apparatus to form on a substrate a first target comprising a first feature and a second target comprising a second feature; wherein the forming of the targets comprises: applying the first feature and the second feature to the substrate by projection of a radiation beam through a patterning device installed in the lithographic apparatus, the features corresponding to one or more of the patterning device, and controlling a configuration of the lithographic apparatus to induce an aberration, such that the first feature is applied to the substrate using a first value of an induced aberration component and the second feature is applied to the substrate using a second, different value of the induced aberration component; measuring a property of the first target and of the second target; and using the measurements to determine a sensitivity of the property of the targets to changes in value of the induced aberration component.

The obtaining of the sensitivity of the target or device may comprise performing a simulation, optionally an imaging simulation.

The forming of the target or device may comprise forming a target and forming a device. The at least one measurement may be to determine a value of an aberration that is present during the forming of the target and a further value of a further aberration that is present during the forming of the device. The obtaining of the sensitivity may comprise obtaining a sensitivity of the property of the target to the aberration and obtaining a sensitivity of a property of the device to the aberration. The predicting may comprise predicting the property of the target and the property of the device.

The further aberration may be the same as the aberration. The further value of the further aberration may be the same as the value of the aberration.

The property of the target may comprise overlay. The property of the device may comprise overlay.

The method may further comprise predicting an offset of the target and the device in dependence on the predicted overlay of the target and the predicted overlay of the device. By predicting an offset based on a measured lens aberration for an individual exposure, a more accurate offset may be obtained.

The predicting of the offset may be in dependence on an applied offset that is applied during the forming of the target and/or during the forming of the device, for example an APC offset.

The method may further comprise using the predicted offset to apply or adjust an offset of the lithographic apparatus. The method may further comprise using the predicted offset to apply or adjust an offset in a subsequent exposure. The method may further comprise using the predicted offset or apply or adjust an offset for a subsequent wafer.

The property of the target or device may comprise overlay. The predicting of the overlay of the target or device may be in dependence on at least one of: an etching effect, a trim effect, a cut effect, a rotation.

The target or device may be a multi-layer target or device. The property may be a property of one of the layers of the target or device.

In a further aspect of the invention, which may be provided independently, there is provided a lithographic apparatus comprising an illumination system for providing a beam of radiation; a support structure for supporting a production patterning device, the production patterning device serving to impart the radiation beam with a pattern in its cross-section; a projection system for projecting the patterned radiation beam onto target portions of the substrate; and a processing resource configured to control operation of the lithographic apparatus; wherein the processing resource is configured to: control the lithographic apparatus to form at least one of a target or device on a substrate; perform at least one measurement to determine a value of an aberration that is present during the forming of the target or device; obtain a sensitivity of a property of the target or device to the aberration; and predict a value of the property of the target or device in dependence on the at least one measurement and on the sensitivity.

Features in one aspect may be provided as features in any other aspect as appropriate. For example, features of a method may be provided as features of an apparatus and vice versa. Any feature or features in one aspect may be provided in combination with any suitable feature or features in any other aspect.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
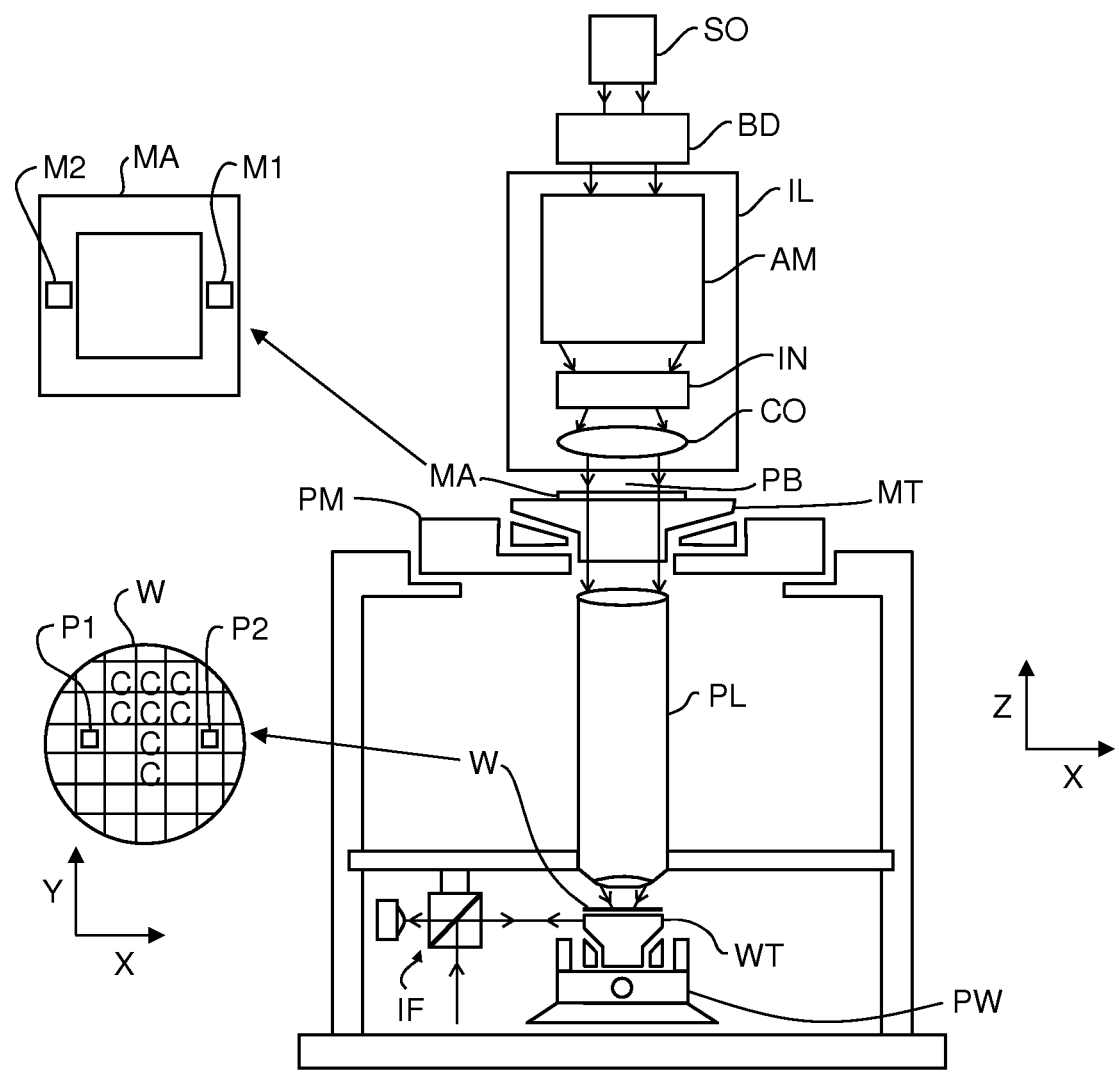
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam PB of radiation (e.g. UV radiation or EUV radiation).

a support structure (e.g. a support structure) MT to support a patterning device (e.g. a mask) MA and connected to first positioning device PM to accurately position the patterning device with respect to item PL;

a substrate table (e.g. a wafer table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In order to ensure that pattern features are applied to a substrate as intended, it may be desirable to at least partially correct for aberrations in or of the lithographic apparatus used to apply those patterns. How a pattern feature (or a property of a pattern feature) responds to an aberration, or a change in an aberration, is definable as aberration sensitivity.

It is known to correct aberrations in or of a lithographic apparatus by controlling a configuration of the lithographic apparatus. Controlling of the configuration of the lithographic apparatus may comprise moving one or more elements of a lens arrangement of the lithographic apparatus, or heating one or more portions of the lens arrangement. The controlling may comprise deforming one or more elements of a lens apparatus of the lithographic apparatus. Moving of the one or more elements may include changing a position or orientation of such elements. Controlling of the configuration of the lithographic apparatus may, alternatively or additionally, comprise moving a patterning device or a part thereof, adjusting the wavelength of the radiation beam, or changing the optical properties of the liquid used in the optical path.

Aberrations that result from conditions of the normal production process (for example, effects of heating or optical surfaces not performing in accordance with theory) may be referred to as existing or intrinsic aberrations.

It is known to determine aberration sensitivity of lithographic features by deliberately inducing an aberration in addition to any intrinsic aberration, and measuring an effect of the deliberately induced aberration on the lithographic features. The aberration may be deliberately induced by controlling the lithographic apparatus using any of the methods that are known in the context of correcting intrinsic aberrations, for example moving or heating elements of a lens apparatus.

In the discussion below, references to inducing of aberrations and to induced aberrations may refer to controlling the lithographic apparatus in such a way as to result in at least one aberration component in addition to any intrinsic aberration. Inducing an aberration may comprise making a change to the radiation beam, for example changing an optical path length of part of the radiation beam, which results in the radiation beam being different from the radiation beam that would occur in the normal production process.

An aberration may be expressed as a combination of aberration components. The aberration components may be expressed as a linear combination of a complete set of basis functions. A particularly convenient set is the Zernike polynomials, which form a set of orthogonal polynomials defined on a unit circle. Aberrations of a lithographic apparatus may be measured and expressed as a set of Zernike coefficients.

An aberration component may be induced that, as far as possible, can be described with only one non-zero Zernike coefficient. The sensitivity to changes in that Zernike coefficient can be determined, for example by exposing different wafers, or different parts of a wafer, with different magnitudes of the Zernike coefficient. Since the Zernike polynomials are orthogonal, the sensitivity of a lithographic feature to a range of aberration components may be ascertained by determining a sensitivity to each of a plurality of Zernike coefficients (which may then be combined if required).

In embodiments of the present invention, different aberration components are induced for different fields of a single wafer, and sensitivity to each aberration component is determined, thereby measuring multiple sensitivities on a single wafer. In some embodiments, each aberration component may be represented by a particular Zernike coefficient, and the aberration component is applied such that the magnitude of the Zernike coefficient changes with position in the target portion. Such a change in magnitude of a particular Zernike coefficient may be referred to as a Zernike tilt.

In embodiments of the present invention, a property (for example, overlay) is measured for metrology targets that match the metrology targets that are used in production (for example, in the manufacturing of a customer's wafer), and conditions such as exposure, illumination and processing conditions match the conditions that are used in production. A measured sensitivity of property of the metrology targets to the aberration may be considered to represent a sensitivity that may occur in production.

The metrology targets may be, for example, μDBO targets. Each μDBO target comprises a grating feature applied to a first lithographic layer and another grating feature applied to a second lithographic layer. The first layer is processed (for example, etched) before the second layer is applied.

In other embodiments, a property is measured for targets that are not metrology targets, for example targets that each comprise part of a device or circuit component.

Figure 2:
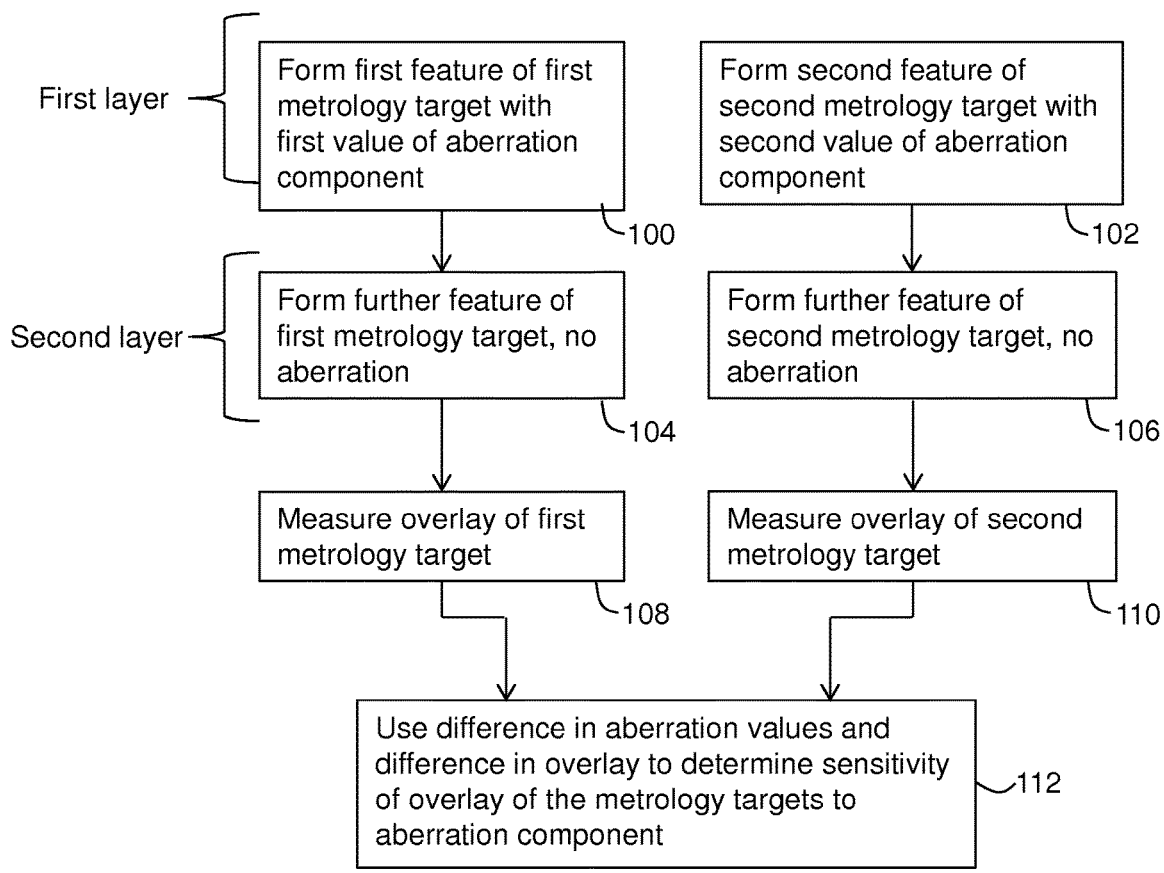
FIG. 2 is a flow-chart illustrating in overview a mode of operation of an embodiment.

FIG. 2 is a flowchart that represents, in overview, a method of an embodiment of the invention. Two targets are referred to in FIG. 2, but in practice any number of targets may be used. In the embodiment of FIG. 2, the targets are μDBO metrology targets. In other embodiments, any other suitable type of target may be used.

At stage 100, a first grating feature, which is part of a first metrology target, is applied to the first layer. A configuration of the lithographic apparatus is controlled such that the first grating feature is applied with a first value of an aberration component, for example, a first magnitude of a given Zernike coefficient (for example, $Z_7$). At stage 102, a second grating feature, which is part of a second metrology target, is applied to the first layer. A configuration of the lithographic apparatus is controlled such that the second grating feature is applied with a second value of the aberration component, (for example, a second magnitude of $Z_7$). The first and second features are applied at different positions on one field of the substrate. The configuration of the lithographic apparatus is controlled to induce a Zernike tilt across the field, such that the magnitude of the Zernike coefficient at the position of the first metrology target is different from the magnitude of the Zernike coefficient at the position of the second metrology target. The first layer is developed and etched before stages 104 and 106 are performed.

At stage 104, a further grating feature of the first metrology target is applied on top of the first grating feature, on a second layer. At stage 106, a further grating feature of the second metrology target is applied on top of the second grating feature, on the second layer. In the embodiment of FIG. 2, no aberration component is induced during stages 104 and 106.

After stages 104 and 106, the resist of the second layer is developed.

The resulting first and second metrology targets differ in the magnitude of the aberration component that was used in applying the grating features to the first layer.

At stage 108, an overlay of the first metrology target is measured. At stage 110, an overlay of the second metrology target is measured. It may be expected that applying one grating feature of a metrology target with an induced aberration and applying the other grating feature of that metrology target without an induced aberration may result in a misalignment of the two grating features of the metrology target, and thus a measured overlay. It may also be expected that a larger measured overlay may result from a larger magnitude of an aberration component.

At stage 112, the measured overlay of the first metrology target is compared to the measured overlay of the second metrology target. The difference in the magnitude of the aberration component that was applied to the first and second grating features is known. The difference in overlay between the two metrology targets may be compared to the difference of the magnitude to determine the sensitivity of the overlay to changes in magnitude of the aberration component.

In practice, most embodiments of the invention use more than two targets for each aberration component, and more than two values of the aberration component. For example, three, four, five or more values of the aberration component may be induced. The different values of the aberration component may be induced in one field, or, in alternative embodiments, different values of the aberration component may be induced for different fields. For example, one field may be exposed with a first magnitude of $Z_7$ for the entire field, and another field may be exposed with a second magnitude of $Z_7$ for the entire field.

The several different values of the aberration component may be used to generate a plot of overlay versus aberration component. In some embodiments, a linear relationship between the overlay and the aberration component is assumed.

In some embodiments, several targets are exposed for each value of the aberration component. The overlay measurements of the several targets may be averaged or otherwise combined.

The process of FIG. 2 may be performed for each of a plurality of different aberration components (for example, different Zernike coefficients). Different aberration components may be used for different fields. For example, a variation in values of a first Zernike coefficient may be used in the exposure of one field, and a variation in values of a second, different Zernike coefficient may be used in the exposure of another field.

In the embodiment of FIG. 2, an aberration is induced while applying features to the first layer, and no aberration is induced while applying features to the second layer. In other embodiments, no aberration is induced for the first layer and an aberration is induced for the second layer. In further embodiments, an aberration may be induced for both layers. A different value of an aberration component may be induced while applying a first feature of a target to the first layer than while applying a further feature of the target to the second layer.

Certain fields of the substrate, other than the field or fields of the first and second metrology targets, may be exposed without any aberration in either the first or second layer. Such fields may be referred to as reference fields. Such fields may be used to correct for the existing lens fingerprint (any existing aberrations that have not been induced for the determination of sensitivities). Such a correction process is described below with reference to the embodiment of FIG. 3.

Figure 3:
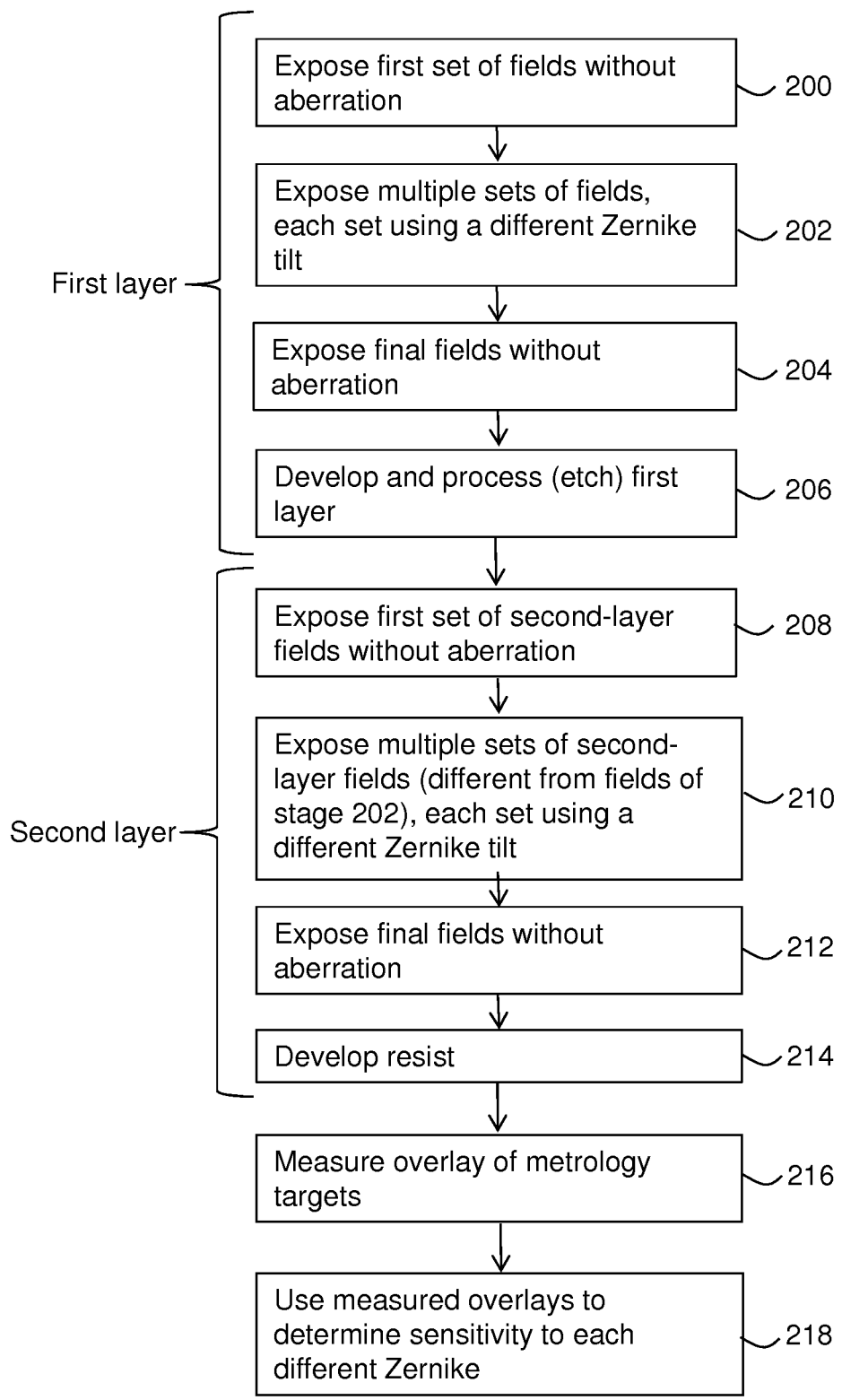
FIG. 3 is a flow-chart illustrating in overview a mode of operation of an embodiment.

The embodiment of FIG. 2 is a simple example described in terms of two targets. FIG. 3 is a flow-chart illustrating in overview a method of a further embodiment in which many targets are used in determining sensitivities to multiple different aberration components on one wafer.

In the embodiment of FIG. 3, a lithographic apparatus, for example the lithographic apparatus of FIG. 1, is used to form metrology targets and desired lithographic features on a substrate by projection of radiation beam PB through patterning device MA onto target portions C of the substrate W. In the embodiment of FIG. 3, the patterning device is a reticle that is used by a customer in production, for example in production of an integrated circuit. The reticle comprises production metrology markers and patterning features that are used in production to form a normal layout of metrology targets and desired lithographic features on the substrate. The customer's normal (dense) layout of features is used.

A plurality of metrology targets is formed on each target portion C (which may also be referred to as a field). In the present embodiment, 13 metrology targets are formed in each field. The metrology targets are all of the same type of metrology target, namely μDBO targets. Each μDBO target comprises a grating feature that is applied to a first layer, and a further grating feature that is applied to a second layer. Each grating feature may comprise multiple gratings, including gratings that extend in different directions from each other. A size of each grating feature may be, for example, around 10 μm×10 μm. In other embodiments, a different type of metrology target may be used, for example a box-in-box target.

The substrate, the exposure conditions, the processing conditions and other conditions are the same as are used by the customer in production, for example in production of an integrated circuit. Therefore, the measured sensitivities to different aberration components that are obtained in the method of FIG. 3 may be representative of sensitivities of the customer's metrology targets as measured in production.

Stages 200 to 206 relate to the exposure and processing of a first layer (which may be any layer of the integrated circuit). The first layer is exposed by exposing each of a plurality of fields in turn. The process of exposing the layers is controlled by a customer exposure recipe. Aberration tilts are added to the customer exposure recipe by attaching a subrecipe that contains the required aberrations to the customer exposure recipe. Multiple aberration components can be introduced by defining multiple images. In the embodiment of FIG. 3, different aberration components are applied to different fields as described below.

In the embodiment of FIG. 3, the exposure is performed by, for each field, scanning a slit in a scanning direction.

At stage 200, some of the fields of the first layer are exposed without inducing any aberration. (There may nevertheless be existing aberrations that have not been deliberately induced. Such existing aberrations may be corrected for as described below.)

At stage 202, the configuration of the lithographic apparatus is controlled to induce an intrafield variation in a first Zernike coefficient, for example $Z_{26}$. No other Zernike coefficient is induced.

A set of fields are each exposed with the induced intrafield variation in the first Zernike coefficient. For each field, different grating features within that field are applied with different magnitudes of the first Zernike coefficient, since the different grating features are applied at different positions in the field, and the magnitude of the first Zernike coefficient varies with position in the field. (In other embodiments, the features of the metrology targets may not be grating features.)

In the present embodiment, the aberration magnitude is constant in the direction of scanning of the slit, but varies across the field (i.e. along the long dimension of the slit).

The configuration of the lithographic apparatus is then controlled to remove the induced variation of the first Zernike coefficient (for example, $Z_{26}$) and to induce an intrafield variation in another, different Zernike coefficient (for example $Z_{20}$). A set of fields are each exposed with the induced intrafield variation of the new Zernike coefficient.

The configuration of the lithographic apparatus is subsequently controlled to induce intrafield variations in further individual Zernike coefficients. A set of fields is exposed for each Zernike coefficient, until fields have been exposed for all Zernike coefficients of interest. In the embodiment of FIG. 3, nine different Zernike coefficients are used, and for each of the Zernike coefficients, three fields of the first layer are exposed with intrafield variation of that Zernike coefficient. In different embodiments, any number of fields may be used for each Zernike coefficient. Any number of metrology targets per field may be used. The sensitivities can be measured on as many metrology targets as needed.

At stage 204, the configuration of the lithographic apparatus is controlled to remove any induced aberration, and a final set of fields of the first layer are exposed without any induced aberration.

At stage 206, the first layer is developed and etched, using the customer's standard processing. The developing and etching of the first layer is the same as the developing and etching of the corresponding layer in a production wafer.

Stages 208 and 210 relate to a second layer, which in the present embodiment is adjacent to the first layer. In other embodiments, additional layers may be present between the first and second layers. A stack may be present between the first and second layers.

In this embodiment, intrafield variations of different Zernike coefficients are applied to the second layer, but to different fields from the fields to which the variations in Zernike coefficient were applied in the first layer at stage 200. Therefore, there exist some fields for which no aberration is induced in either the first or the second layer, some fields for which an aberration is induced in the first layer but not the second layer, and some fields in which an aberration is induced in the second layer but not in the first layer. In the present embodiment, there are no fields to which an aberration is induced in both the first layer and the second layer, but there may be such fields in other embodiments.

In some embodiments, sensitivities from only one layer (either first or second) are required. Aberration is induced in only one layer and the other layer is exposed without any induced aberration.

At stage 208, some of the fields of the second layer are exposed without any induced aberration. The fields that are exposed at stage 208 include some but not all of the fields for which the first layer was exposed without aberration at stage 200. (Some of the fields for which a first layer was exposed without aberration at stage 200 will have an aberration induced in the second layer at stage 210.)

Fields that were exposed without aberration at both stage 200 and stage 208 may be referred to as reference fields. Targets that are formed in reference fields may be referred to as reference targets. For each layer, the reference fields are exposed before any aberration is induced. Therefore, the reference fields may be used to determine any aberration in the system that is not an induced aberration, as described below.

At stage 210, the configuration of the lithographic apparatus is controlled to induce intrafield variations in each of the nine Zernike coefficients in turn, and three fields are exposed for each of the nine Zernike coefficients. The fields that are exposed with aberrations at stage 210 are fields for which no aberration was induced in the first layer. The fields for which aberrations are induced in the second layer at stage 210 are different from the fields for which aberrations were induced in the first layer at stage 202.

At stage 212, the final fields are exposed without any induced aberration. The final fields that are exposed in stage 212 are the same as the final fields that were exposed for the first layer in stage 206. Targets that are formed in the final fields may be referred to as further reference targets. Each layer of each of the final fields is exposed after all the aberrations have been induced and the system has been returned to a state of no induced aberrations. Measurements of the final fields may be used as a check to determine whether an intrinsic aberration in the system has changed during the inducing of the aberrations, as described below.

At stage 214, the resist of the second layer is developed.

Figure 4:
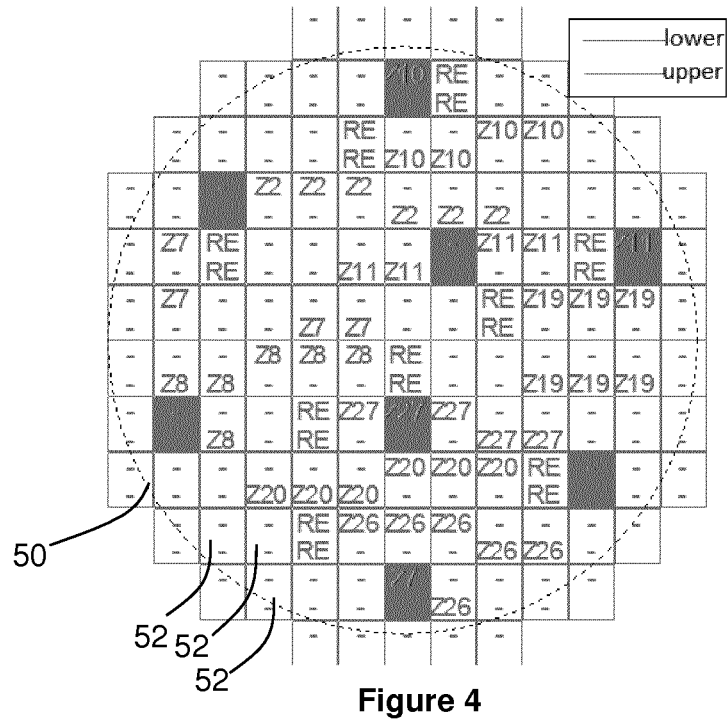
FIG. 4 schematically depicts an exposure sequence of an embodiment.

FIG. 4 is a schematic diagram that represents the aberration components applied to target portions (field 52) of the substrate (wafer 50) in the embodiment of FIG. 3. Fields 52 of the wafer 50 are represented as boxes in FIG. 4. The lower part of each box is representative of the first (lower) layer and the upper part of each box is representative of the second (upper) layer.

A dash in the upper or lower part of the box indicates that the upper or lower layer was exposed without any aberration, before any aberration was induced in that layer (i.e. stages 200 or 208 of FIG. 3). If two dashes are present in a given box, that field is a reference field.

A Z number (for example, Z2, Z10, Z27) in an upper or lower part of the box indicates that the upper or lower layer was exposed with an aberration component corresponding to the Z number in the box (for example, Z26 in the upper part of the box indicates that an intrafield variation of the $Z_{26}$ coefficient was induced for the upper layer).

RE in the upper and lower part of a box indicates that the field is a final field, which may also be called a further reference field. Each layer of a final field is exposed after aberrations have been induced for that layer and the system has been returned to a state of no induced aberrations (i.e. stages 206 and 212 of FIG. 3).

At stage 216 of FIG. 3, the wafer is loaded on to a standard overlay metrology tool, for example a diffraction based overlay (μDBO) metrology tool. The metrology tool is used to measure the overlay of each of the metrology targets in each of the fields. Each of the metrology targets comprises a grating feature in the first layer and a further grating feature in the second layer (where the first layer is processed and the second layer is photoresist). The overlay between the grating features is measured using an interferometric method. The overlay measurements are stored.

In other embodiments, a different type of metrology target may be used. A different metrology tool and/or measurement method may be used to measure the metrology targets.

Figure 5:
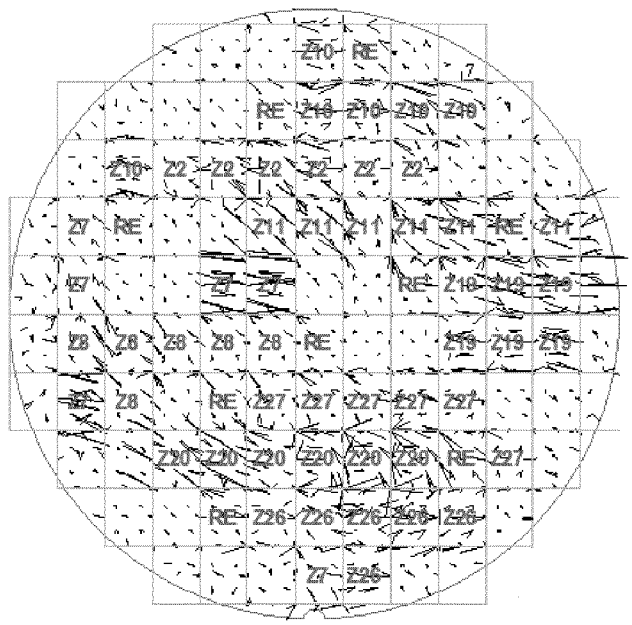
FIG. 5 schematically depicts measured overlays from the exposure sequence of FIG. 4.

FIG. 5 schematically illustrates the wafer of FIG. 4, with overlay measurements superimposed. The induced aberrations are the same as for FIG. 4. In FIG. 5 only the aberration (for example, Z26) is indicated, without showing to which layer the aberration is applied. However, the layer may be found by looking at the corresponding field in FIG. 4.

Each field has 13 metrology targets. Superimposed on the position of each metrology target are two arrows, which represent the overlay measurements obtained for that target on two wafers (each with the same induced aberrations). The length and direction of each arrow represent the magnitude and direction of the measured overlay.

It may be seen that the measured overlays are much greater for some metrology targets than for others. For fields to which a variation in Zernike coefficient is applied, the overlays are, in general, greater for metrology targets at the edge of the field than for metrology targets at the centre of the field, since the magnitude of the applied Zernike coefficient is greater at the edges of the field than at the centre of the field.

Some Zernike coefficients result in larger overlays than others. In the illustrated example, on average, larger overlays are measured in the fields that were exposed with a variation in $Z_{20}$ than in the fields that were exposed with a variation in $Z_8$.

Figure 6:
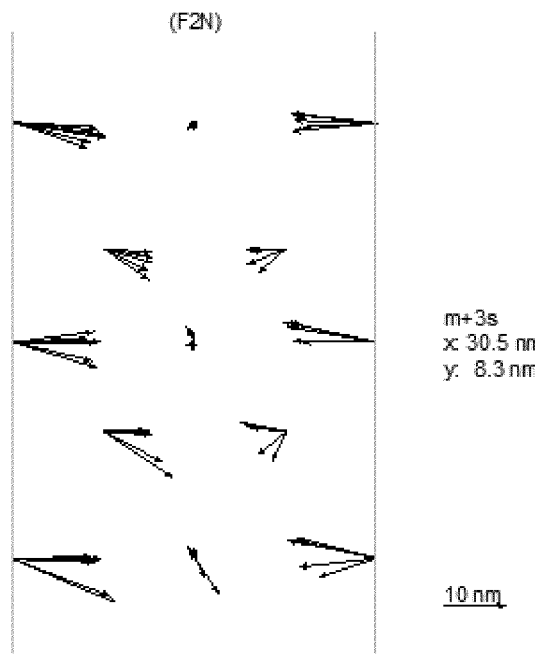
FIG. 6 is a plot of overlay measured in multiple fields for a specific Zernike.

FIG. 6 is a diagram that is representative of overlay results for a given Zernike coefficient. In this particular example, the Zernike coefficient is $Z_7$. Measured overlay results for the 13 metrology targets are again represented as arrows. The results from three different fields are superimposed in FIG. 6, each of the three fields having been exposed with the same variation of Zernike coefficient across the field and having metrology targets at corresponding positions in the field. As is the case in FIG. 5, results from two wafers are superimposed. Therefore, 6 arrows are illustrated for each of 13 metrology target positions in the field.

In FIG. 6, the direction of variation of the Zernike coefficient is from the left to the right of the diagram. At the middle of the field, the value of Zernike coefficient may be near zero and a low magnitude of overlay is measured. The magnitude of the Zernike coefficient increases towards the sides of the field, and the two sides have Zernike coefficients of opposite sign. In general, the measured overlay is greater for greater magnitude of the Zernike coefficient.

Figure 7:
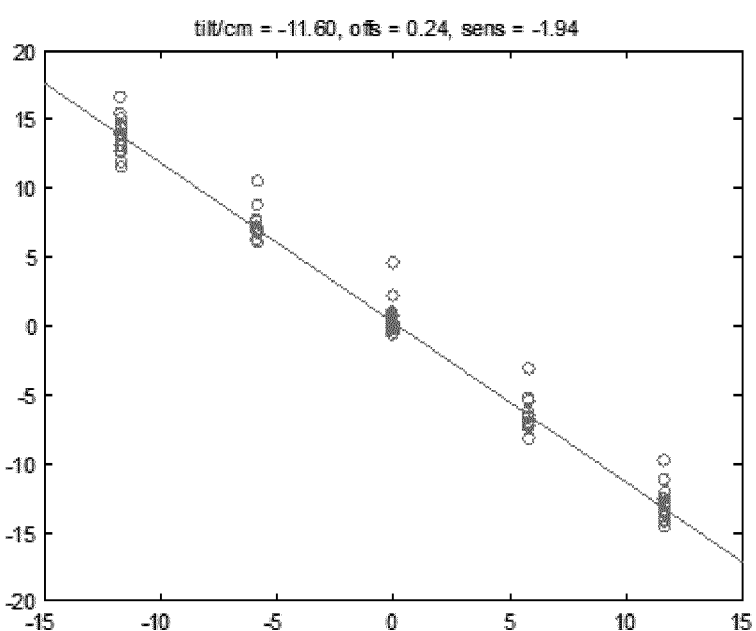
FIG. 7 is a plot of overlay data plotted as a slit fingerprint and linearly fitted.

FIG. 7 is a plot of measured overlay (on the vertical axis, in nm) versus position (horizontal axis, in mm) for each metrology target in the six fields (three fields on each of two wafers) that are represented in FIG. 6. The position is the position of the metrology target along the long dimension of the slit, where 0 is at the centre of the slit. Position is measured in the same direction as the variation in Zernike. The overlay is plotted as a slit fingerprint and linearly fitted. The fitted line is representative of overlay tilt (change in overlay with position).

At stage 218, the measured overlays for the metrology targets (for example, the overlays that are represented in FIGS. 4, 5 and 6) are used to determine sensitivity of the overlay of the metrology targets to changes in each of the induced aberration components.

Firstly, the measured overlays for the reference fields are used to determine a reference lens fingerprint. The reference lens fingerprint is representative of a profile of overlay within the field that is caused by any existing, intrinsic aberration. The intrinsic aberration may be an aberration that would occur in normal production. The reference lens fingerprint is obtained by averaging the overlays from the reference fields. The reference lens fingerprint comprises an intrinsic overlay value for each of the 13 metrology target positions.

To remove background noise, fields without any corrections (any induced aberrations) are used in order to measure the reference lens fingerprint. The fingerprint is used to remove the existing aberration in the lens so that only the induced tilt remains in the overlay fingerprint.

Once the reference lens fingerprint has been obtained, the intrinsic overlay values of the reference lens fingerprint are subtracted from the measured overlays for the other fields (that are not reference fields) to correct for the intrinsic aberration. In other embodiments, any appropriate method for compensating for intrinsic aberrations may be used.

In order to determine sensitivities, it is assumed that the relationship between pattern shift and aberration is linear (i.e. that the sensitivities are constant). In other embodiments, a non-linear relationship between pattern shift and aberration is assumed and the calculation below is adjusted accordingly.

In general, if the relationship is linear, the overlay induced by pattern shift may be taken to be $$\text{Overlay} = \Sigma [s_i^{(layer2)} - s_i^{(layer1)}] * Z_i \text{ (summing over all odd Zernike polynomials)}$$

here $Z_i$ is the Zernike of number i, $s_i^{(layer1)}$ is the sensitivity to $Z_i$ in the first layer and $s_i^{(layer2)}$ is the sensitivity to $Z_i$ in the second layer. The sum is over all odd Zernike polynomials that are present.

Since in the method of the present embodiment, for any given field a variation of single Zernike coefficient is induced in one layer only, after subtracting the average reference field overlay to remove the reference lens fingerprint, the equation for overlay reduces to:

$$\text{Overlay} = s_i * Z_i = s_i * \text{induced tilt}$$

For a given aberration component (for example, a given Zernike coefficient), sensitivity is calculated by doing a linear fit on the overlay data:

$$s_i = \text{overlay tilt/induced tilt}$$

where the induced tilt is the induced variation in Zernike coefficient across the field. The induced tilt is known from the Zernike coefficient variation that has been applied by controlling the lithographic apparatus. The overlay at each metrology target has been measured by the metrology tool, and the positions of the metrology targets are known. Therefore an overlay tilt (variation in overlay with position across the field) may be calculated. In this embodiment, the overlay data may be described as intrafield overlay data, since the Zernike coefficient that is applied varies across a single field.

Turning again to FIG. 7, the points on the plot of FIG. 7 are individual measurements of overlays for different positions of metrology targets within the relevant fields, and the line fitted to the points is representative of an overlay tilt (change in overlay with position). Since the change in aberration with position is known, a sensitivity can be calculated by dividing the overlay tilt by the induced Zernike tilt.

The determination of sensitivity is repeated for each of the induced aberration components. In the embodiment of FIG. 3, results from 6 fields (3 fields on each of 2 wafers) are used in determining the sensitivity to each aberration component. Sensitivity to aberrations in the first layer and sensitivity to aberrations in the second layer may be determined separately. For example, a sensitivity to a $Z_{20}$ variation in the first layer may be different to a sensitivity to a $Z_{20}$ variation in the second layer.

The overlay results from the final fields (RE in FIGS. 4 and 5) may be used to ascertain whether there has been any change in the intrinsic aberration during the exposure of the wafer. The overlay results from the final fields (which were the last to be exposed) may be compared to the reference lens fingerprint to determine whether there is any change in overlay. Since the configuration of the lithographic apparatus can take several seconds to change from one induced aberration component to another, a final correction with a zero or near-zero offset is performed to check for optical column stability, for example lens heating during the exposure or sudden drifts.

The exposure time for the wafer using the method of the invention may be longer than a usual exposure time for that wafer in production, because the configuration of the lithographic apparatus must be adjusted to provide different Zernike polynomials for different fields. The adjustment may add to the exposure time such that an exposure that would take less than a minute in production may take several minutes using the method of the invention. Therefore, there may in some circumstances be greater lens heating when performing an exposure using the method of the invention than when exposing the wafer in production. The overlay results from the final fields may be used to determine whether any such extra heating has resulted in additional aberrations.

If there is a small offset in overlay between the reference fields and the final fields, this offset may be corrected for, since good models of lens heating behaviour are available. If a larger offset in overlay between the reference fields and the final fields is measured, it may be preferable to repeat the test.

By using the method of FIG. 3, on-product aberration sensitivity is measured. The sensitivities measured are the sensitivities of a type of metrology target that is used in production, including effects of specific customer conditions. The sensitivities measured may include effects from wafer processing, which may not be able to be simulated. Multiple sensitivities may be measured on a single wafer. The single wafer may be processed through the manufacturing line. The customer's normal (dense) layout may be used. The number of targets needed to get sensitivity measurements may be minimized, which may be due to the tilt-to-tilt Zernike-to-overlay relationship inside a single field. The method of FIG. 3 uses a customer reticle and exposure conditions matching the manufacturing process. Metrology time may be minimized, for example by using existing metrology targets and metrology tools.

The measured sensitivities may potentially make it possible to simulate any offset between metrology targets and device features in order to predict offsets used for APC in a feed-forward fashion (as opposed to measuring those offsets after the fact).

If there is a mismatch in overlay sensitivity between metrology targets and device features, offsets may be added to an APC to compensate for such a mismatch. If the mismatch in sensitivity is large, then the overlay measured by the metrology tool (by measuring the metrology target) will not match the real overlay of the device feature. In that case, using the measured overlay may introduce an overlay error to the device feature, instead of correcting overlay. In known methods, customers may have to measure overlay after etch (sometimes using destructive methods) in order to calculate a metrology-device offset. However, by using the method of FIG. 3, it may be possible to predict such an offset using the sensitivities and data from the scanner. If the offset can be predicted, it may be possible to correct APC without obtaining after-etch measurements.

By using the method of FIG. 3 as described above, determining aberration sensitivities may be made simpler and more practical. The method of FIG. 3 may be used for research and development purposes, such as metrology target accuracy optimization. The method of FIG. 3 may be used for root-cause analysis of overlay performance degradation due to lens aberrations.

Multiple sensitivities of multiple targets, on multiple layers, may be measured using a single wafer in production conditions. It may be possible to use customer (production) recipes with minimal modification by attaching a subrecipe to the customer recipe. There may in some circumstances be a large reduction in the time required for overlay metrology.

The method of FIG. 3 may be used to determine in-resist sensitivities as well as full-flow sensitivities, which include processing of the lower layer, to get the actual effect of aberration-induced pattern shift on a target as measured by the metrology tool. The sensitivity of features in the lower layer may change with processing, so using a method in which the lower layer is processed before overlay is measured may lead to more accurate measurements of the sensitivity of properties of features on the lower layer, and of the sensitivity of properties of the metrology tool as a whole.

In some embodiments, sensitivities in only one layer (either upper or lower) are measured.

For overlay targets, one may measure both a layer with resist processing and a layer with wafer processing. The lower layer of the overlay target is processed (for example, etched), and the top layer is resist. The full stack between these two layers may also be present to measure representative sensitivities.

Figure 8:
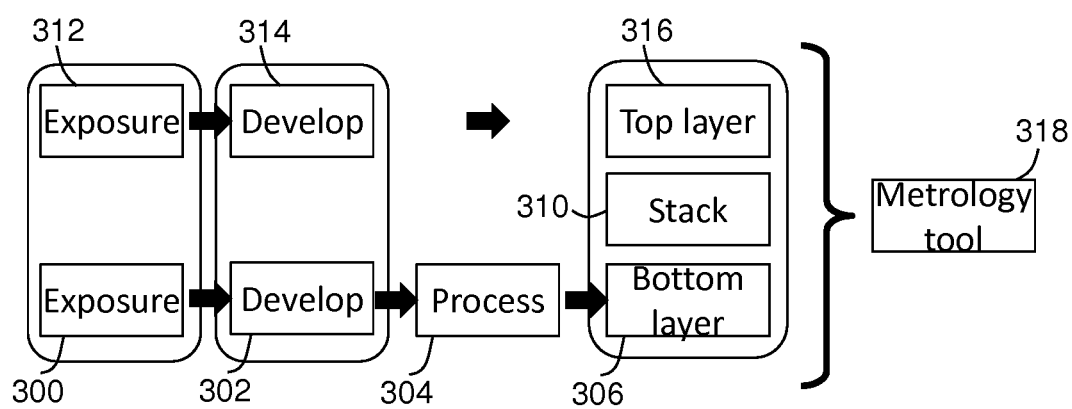
FIG. 8 is a schematic illustration of first and second layers.

FIG. 8 is a schematic illustration that summarises the processing of the first (bottom) layer and second (top) layer. In the embodiment of FIG. 8, the bottom layer and top layer are separated by a stack. At stage 300, the bottom layer is exposed as described with reference to stages 200 and 204 of FIG. 3. Some fields are exposed without aberration, and some with different aberrations. At stage 302, the bottom layer is developed. At stage 304, the bottom layer is processed (for example, etch). At the stage at which it is measured, bottom layer 306 has been subjected to wafer processing.

The full stack 310 between the bottom and top layers is also exposed and processed appropriately.

At stage 312, the top layer is exposed as described with reference to stages 208 to 212 of FIG. 3. At stage 314, the resist is developed. The top layer 316 that is measured has been subject to resist processing only.

For overlay targets, the lower layer is processed and the top layer is resist. The presence of the full stack between the two layers may allow for the measurement of sensitivities that are representative of those occurring in production.

Rather than measuring how the aberration affects the image produced by the projection lens, the method of FIG. 3 may measure how the aberration affects the overlay measurement that is obtained by measuring a metrology target in production.

Device-feature sensitivities can also be determined by applying the same method while measuring the device overlay after etch using CD-SEM (Critical Dimension Scanning Electron Microscopy).

In the embodiment of FIG. 3, variations in Zernike coefficients are induced for some of the fields of the wafer by attaching a subrecipe that contains all required aberrations to the customer exposure recipe. Multiple aberrations may be introduced by defining multiple images. In some embodiments, a user may select which Zernike tilts should be used with which field and add the required Zernike tilt to the customer exposure recipe. In some embodiments, the Zernike tilts may be added to the customer exposure recipe automatically in response to a user request. For example, the user may request particular Zernike tilts by providing inputs to a processing resource, and the processing resource may select fields to which the Zernike tilts will be applied, and modify the customer exposure recipe accordingly.

An integrated circuit may comprise a large number of layers. The method of FIG. 3 may be used to determine overlay for any two layers using the customer's metrology targets for those layers. The two layers need not be adjacent. The method of FIG. 3 may be repeated for different metrology targets on different layers.

In the discussion above with relation to FIG. 3, each Zernike coefficient is independently introduced. A non-zero value of a particular Zernike coefficient is induced while no other Zernike coefficient is induced. However, in practice, some Zernike coefficients can be independently introduced while others have parasitic effects (non-zero values of undesired Zernike coefficients are also introduced). In some cases, the introduction of parasitic effects is minimal and can be ignored. However, if the parasitic Zernike coefficients are too large, for example in the case of $Z_8$ and $Z_{11}$, all involved Zernikes may be measured and the sensitivities may be obtained by solving a linear N-variable system of N equations. Cross-talk issues can be identified ahead of time using the lens model and can be automated.

In the embodiment of FIG. 3, a single type of metrology target is used, which is a type of metrology target that is used by the customer in production.

In alternative embodiments, the metrology targets may comprise metrology targets that are not the targets that are usually used by the customer, for example metrology targets that have been chosen specifically for the aberration sensitivity measurement. Different types of metrology targets may be measured for the purposes of research and development of metrology targets.

In some embodiments, the method of FIG. 3 is used to measure the sensitivities of different types of metrology target. In an embodiment, several different types of metrology marker are formed on the substrate by exposing the substrate using a reticle comprising several different metrology markers. For example, a reticle may be used on which several different types of metrology targets are placed near to each other at a number of different points in each field. The sensitivity of each of the types of metrology target to each of the Zernike coefficients is determined using the method of FIG. 3. In an example, sensitivity to several different aberration components is determined for each of several types of metrology target, all on one wafer.

The measured sensitivities of the different metrology targets may be compared to simulated or measured device sensitivities. In some embodiments, the metrology target that has sensitivities that best match the simulated device sensitivities may be selected for future use. The measured sensitivities may be used to optimize metrology targets for better accuracy (better matching with device). For example, metrology target sensitivities may be measured using the method of FIG. 3 and device-feature sensitivities may be measured for the same wafer using CD-SEM. The sensitivities may be compared, and the metrology target that has a sensitivity that best matches the device sensitivity may be selected.

In some embodiments, sensitivity results may be used to optimise a metrology recipe of the metrology tool. For example, the sensitivity results may be used to determine which wavelength to use (for example, to minimise sensitivity or to match sensitivity to the sensitivity of a device feature).

In the embodiment of FIG. 3, each induced aberration is applied as a Zernike tilt (a change in magnitude of a particular Zernike polynomial across a given field). In other embodiments, a single magnitude of a given Zernike polynomial may be applied across the whole of one field, and a different magnitude of the same Zernike polynomial may be applied across the whole of a different field. A fixed value of the Zernike coefficient may be applied across the whole slit during an exposure of a field. Such a method may be referred to as a Zernike offset (between fields) instead of a Zernike tilt (within one field). Overlay data used for calculating sensitivities may be taken from different fields having different magnitudes of the same Zernike coefficient. A method using a Zernike offset may require more fields to be exposed per Zernike component than a method using a Zernike tilt, since it may be necessary to measure multiple offsets (and hence multiple fields, each with a different value of Zernike coefficient) for each different Zernike polynomial.

In the embodiment of FIG. 3, aberrations are induced using an aberration manipulator which is placed into the projection lens near the pupil plane and can provide aberration correction up to Zernike number 64. Aberrations are induced by selectively heating parts of the aberration manipulator to change the optical path length in those parts of the aberration manipulator. In other embodiments, any suitable configuration of the lithographic apparatus may be controlled, for example by moving or deforming elements of a lens arrangement.

The order in which the different Zernike polynomials are induced may be optimized to minimize the time it takes for the configuration of the lithographic apparatus to change from each Zernike polynomial to the next (for example, in stage 202 or 210 of FIG. 3). In one embodiment, the configuration of the lithographic apparatus is changed by changing the configuration of a lens manipulator. The order of the Zernikes may be optimized to minimize the time it takes for the manipulator plates to move between each correction. The ordering may be chosen based on minimum transition time, maximum transition time, total transition time for all transitions, or any other property of the transition times.

In semiconductor processing, an overlay of device features may be controlled by measuring overlay on metrology targets after lithography exposure rather than directly on device features after wafer processing. In some circumstances, the target overlay may not match the device overlay due to mismatched sensitivities between overlay targets and device targets.

In order to compensate for a mismatch between the overlay of metrology targets and the overlay of device features, offsets may be introduced into the process control loop. Using offsets to compensate for the mismatch between the overlay of metrology targets and the overlay of device features may optimize device overlay and/or improve yield.

To determine offsets, a wafer may be processed after photolithography (for example, etching) and the device overlay may be measured. The measurement of the device overlay may comprise using destructive techniques, for example decapsulated CD-SEM. The target overlay may be measured using any suitable method, for example using a standard overlay metrology tool as described above.

An offset between the overlay of metrology targets and the overlay of device features may not be stable with time. Therefore, in some known systems, measurements by CD-SEM are conducted regularly. A frequency of measurement by CD-SEM may be high.

A high frequency of measurement by CD-SEM may cause significant wafer loss, significant labour costs and/or an increase in complexity of a process control methodology. Due to the time required to process and measure the wafers, there may be a delay in a feedback loop. For example, it may take time for a wafer to be measured, during which time further wafers may be being produced without taking into account the measurements obtained from the measured wafer. The delay in the feedback loop may further decrease the effectiveness of process control.

Figure 9:
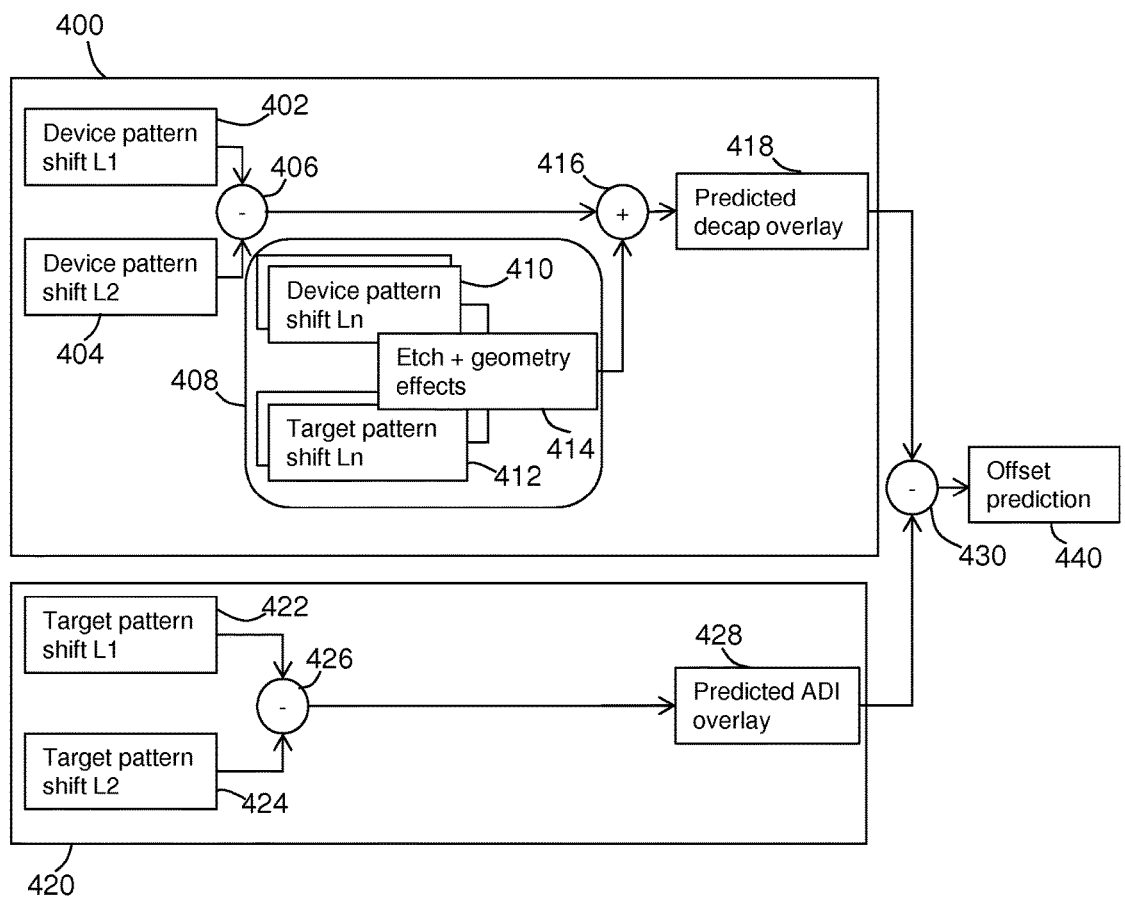
FIG. 9 schematically illustrates a conceptual overview of a computational offset prediction process.

FIG. 9 is a flow chart representing in overview a process for computational offset prediction. In the method of FIG. 9, an offset between an overlay of a device and an overlay of a target is predicted instead of being measured (for example, measured destructively using CD-SEM). The device may comprise any suitable device, device feature and/or circuit component. The target may comprise any suitable metrology target, for example a μDBO target. In other embodiments, the target may comprise an alignment mark or any other suitable target.

Although FIG. 9 is representative of a prediction of an offset between a single device and a single metrology target, in practice the process of FIG. 9 may be used for each of a plurality of device-target pairs.

In the present embodiment, each stage of the process of FIG. 9 is performed by a processor. The processor may be part of the lithographic apparatus and/or part of a control system. In other embodiments, any suitable computational component(s) or apparatus(es) may perform the process of FIG. 9.

In overview, at stage 400 of FIG. 9 the processor predicts an overlay of the device. At stage 420, the processor predicts an overlay of the target. At stage 440, the processor uses the overlay of the device as predicted at stage 400 and the overlay of the target as predicted at stage 420 to predict an offset between the overlay of the device and the overlay of the target. The predicted offset may be used to apply or adjust an offset of the lithographic apparatus, for example to apply or adjust an offset in an APC model.

We turn in detail to stage 400, the predicting of the overlay of the device. In the embodiment of FIG. 9, the device comprises features on two lithographic layers, L1 and L2.

Stage 400 comprises stages 402 to 418. At stage 402, the processor determines a pattern shift for a first feature of the device on layer L1. Pattern shift may be determined based on lens aberration data and aberration sensitivities. In the present embodiment, pattern shift is determined using the equation:

Pattern shift=$\Sigma s_i * Z_i$, where $s_i$ is the aberration sensitivity to Zernike $Z_i$. The processor obtains values for aberration sensitivity for the first feature of the device. For example, the processor may obtain a sensitivity of the first feature of the device to each of a plurality of Zernikes $Z_i$. In the present embodiment, the processor obtains the values for aberration sensitivity for the first feature from an imaging simulation. In other embodiments, the values for aberration sensitivity may be any suitable simulated or measured sensitivity values.

The processor obtains lens aberration data. The lens aberration data comprises values for lens aberration that are representative of a lens aberration present in the lithographic apparatus while the first feature of the device is being formed on layer L1 of the substrate.

The values for lens aberration may be measured values. The measured values may be obtained by measuring aberration during an exposure in which the first feature is formed. Measuring the aberration may comprise measuring wave front aberrations of a projection system of the lithographic apparatus.

In the present embodiment, the lens aberration data comprises residuals from a driver lens model, which are exported after exposure of the layer L1. The driver lens model residuals are exported immediately after the exposure of L1 is complete, and may be stored, for example in a server. The driver lens model residuals may be stored until the process of FIG. 9 is performed. The driver lens model residuals may be stored until the computed offset is needed.

The lens aberration data may be based on input from sensors and feedforward simulations. The lens aberration data may include contributions representative of lot corrections, process corrections and/or lens heating. The lens aberration data is specific to the individual exposure in which the first feature is formed. In some circumstances, there may be several exposures for each layer.

Lens aberration data may or may not include corrections from a lens manipulator. A lens aberration may change with time, for example due to heating. In some embodiments, a predicted lens aberration may be used, or a combination of prediction or measurement. In some embodiments, some Zernikes are measured and other Zernikes are simulated. For example, low order Zernikes may be measured and high order Zernikes may be simulated.

The processor determines a pattern shift for the first feature of the device using Pattern shift=$\Sigma s_i * Z_i$, where the sensitivities $s_i$ are obtained from the imaging simulation and the aberration components $Z_i$ are obtained from the driver lens model residuals for the exposure in which the first feature is applied to the substrate.

At stage 404, the processor determines a pattern shift for a second feature of the device on layer L2. The process of stage 404 is similar to that of stage 402, but uses sensitivities for the second feature, and lens aberration data for the exposure of layer L2 in which the second feature is formed.

In the present embodiment, the sensitivities $s_i$ for the second feature are obtained from imaging simulation. In other embodiments, any suitable simulated or measured sensitivities may be used. The lens aberration data $Z_i$ comprises driver lens model residuals for the exposure in which the second feature is formed on layer L2. In other embodiments, any suitable lens aberration data is used that is representative of the aberration during the exposure of layer L2. The pattern shift for the second feature of the device is calculated using Pattern shift=$\Sigma s_i * Z_i$.

At stage 406 of the process of FIG. 9, the processor subtracts the pattern shift for the first feature (from stage 402) and the pattern shift for the second feature (from stage 404) to obtain an initial value for overlay of the device. The initial value for overlay comprises a difference between the pattern shift for the first feature and the pattern shift for the second feature.

In order to obtain an accurate prediction for device overlay, factors other than pattern shift may be taken into account. In some circumstances, an offset may be partially scanner (lens) related and partially due to processing. For example, an offset may be partially related to differences in sensitivities, and partially related to processing step such as etching. In some circumstances, etching or other processing may have a different effect on the overlay of device features than it has on overlay of features of a metrology target.

In order to get from pattern shift to overlay, one may consider, for example: the correct interaction between the layers involved; the accuracy of the sensitivities; and whether the aberrations used in the calculation of pattern shift are representative of the actual exposure conditions. The accuracy of the sensitivities may be addressed by improved simulation of sensitivities and/or by the use of measured sensitivities. As described above, representative aberrations may be obtained by using actual measured aberration values that are specific to the exposure in which a particular feature is formed.

Determining the correct interaction between the layers involved in the formation of the final device feature may involve more than two layers (for example, more than just the layers L1 and L2). In some embodiments, a trim or cut mask is used, for example in embodiments with smaller device feature sizes.

Factors to be considered in determining the correct interaction between the layers may include, for example, factors A to D as listed below:

A. Any geometrical effects due to rotated features, such as in the case of a DRAM active layer. A DRAM active layer may be printed with a rotation with respect to bitlines and wordlines. The rotation angle may cause distortions from lens aberrations in each layer to combine in a non-trivial manner. Y distortions may affect X positions, and vice versa. In DRAM or in other circumstances in which a rotation is used, the features themselves may not be orthogonal. By contrast, Zernikes are normally measured orthogonally. In some circumstances, it may be difficult for a metrology target to include rotation. A metrology target may be measured in x and y.

B. Effect of trim or cuts. Where a trim or cut mask is used, the effect of the trim or cut mask may change the pattern shift.

C. Any APC model applied in the customer flow may be considered. The effect of aberrations may introduce an overlay error into the device. In some circumstances, offsets may already be applied in the APC to compensate for a difference in overlay between the target and the device. Such existing offsets may be taken into account when determining overlay based on pattern shift. For example, when calculating a pattern shift, the processor may include the effects of any offset that has been added by the APC model.

D. Effects from etching. The effects of etching may also change the pattern shift.

At stage 408, the processor determines the effects of one or more of points A to D above. In the present embodiment, stage 408 comprises stages 410, 412 and 414. At stage 410, the processor determines a pattern shift for at least one layer Ln of the device. The processor may determine pattern shifts for at least two layers of the device. At stage 412, the processor determines a pattern shift for at least one layer Ln of the target. The processor may determine pattern shifts for at least two layers of the target. For example, for each of the device and the target, the processor may determine a pattern shift for L1 and for an additional cut mask layer. At stage 414, the processor uses the device pattern shift(s) of stage 410 and the target pattern shift(s) of stage 412 in determining etch and geometry effects.

In some embodiments, an etch model is used at stage 414. In other embodiments, an image processing method may be used to mimic the etch process.

Etch effects may include faster etching of narrow features and/or rounding of corners or edges. The inclusion of etch effects may cause a pattern shift to change. For example, a pattern shift of a feature when applied to L1 may be changed when a cut mask is applied and/or when etching is performed. The effect of etching on a feature may depend on its proximity to other features. Proximity to other features may result in a pattern shift. Effects of etching on a feature may be modelled based on the environment of that feature.

In some embodiments, a measurement technique comprises measurement of a feature that is changed by etching. For example, a measurement may be made based on a corner of a feature. Etching may change the position of the corner, for example by rounding the corner. Etch effects may be included in order to predict the measurement more accurately.

At stage 416, the processor adjusts the initial overlay value obtained at stage 406 by including the effects of etch and geometry effects obtained from stage 408. In other embodiments, any suitable effects may be determined at stage 408 and combined with the initial overlay value of stage 406. Further examples of adjusting an overlay value in dependence on an interaction between layers (for the 20 nm $6F^2$ DRAM bitline-active case) are described in Proc. SPIE 9426, Optical Microlithography XXVIII, 942608 (Mar. 18, 2015). In some embodiments, the relative geometries, the measurement method, and the shape of each feature are considered in detail in order to determine etch and/or geometry effects.

At stage 418, the processor generates a predicted overlay for the device. The predicted overlay may comprise a prediction for an overlay that would be measured if the device were to be measured using CD-SEM. The predicted overlay may be referred to as a predicted decap overlay.

In some embodiments, no initial overlay value is calculated. Sensitivities and aberration data or pattern shift values (and, optionally, any suitable effects such as any of A to D above) may be used directly to calculate a final value for overlay. In further embodiments, any of stages 402 to 418 may be omitted and/or additional stages may be added.

We turn to stage 420 of FIG. 9, the predicting of the overlay of the metrology target. In the present embodiment, the metrology target comprises features on two layers, L1 and L2, which are the same layers on which the features of the device are formed.

Stage 420 comprises stages 422 to 428. At stage 422, the processor obtains values for aberration sensitivity for a first feature of the target on first layer L1. For example, the processor may obtain a sensitivity of the first feature to each of a plurality of Zernikes $Z_i$. The value for aberration sensitivity may be values of sensitivity obtained from measurement of one or more previous wafers.

In the embodiment of FIG. 9, the values for aberration sensitivity for the target are values that have been determined using the method described above with reference to FIG. 3. In the method of FIG. 3, sensitivities are obtained by measurement of a wafer that has been exposed using different values of each of a plurality of induced Zernikes. In other embodiments, the sensitivity values obtained at stage 422 may be any suitable simulated or measured sensitivity values.

In some circumstances, imaging simulations may not be accurate enough to predict the overlay of metrology targets to a desired accuracy. In some circumstances, it may be desirable to perform an experimental verification or calibration of overlay, especially in the case of the metrology targets. In the present embodiments, measured sensitivities for the metrology targets are used, while simulated sensitivities are used for the device.

In some embodiments, imaging simulation is used to obtain the sensitivities for the metrology target. In some embodiments, a combination of imaging simulation and measured aberration sensitivities is used to obtain the sensitivities for the metrology target.

The processor obtains lens aberration data. In the present embodiment, the lens aberration data used at stage 422 for determining the pattern shift of the first feature of the target is the same as the lens aberration data used at stage 402 for determining the pattern shift of the first feature of the device. The lens aberration data is representative of an aberration present in the lithographic apparatus during the forming of the first feature of the target and of the first feature of the device. In other embodiments different lens aberration data may be used.

The processor determines a pattern shift for the feature of the target on layer L1 using Pattern shift=$\Sigma s_i^* Z_i$, where the sensitivities are the measured sensitivities from the process of FIG. 3 and the lens aberration data comprises driver lens model residuals as described above with reference to stage 402.

At stage 424, the processor obtains sensitivity values and lens aberration data for a second feature of the target on layer L2 using a similar method to that described for stage 422. The sensitivity values for the second features are obtained from measurements made using the method of FIG. 3. The lens aberration data comprises the same lens aberration data as is used at stage 404 for the second feature of the device.

At stage 426, the processor obtains a value for an overlay for the target by subtracting the pattern shift for the first feature of the target determined at stage 422 and the pattern shift for the second feature of the target determined at stage 424 of the target.

At stage 428, the processor generates a predicted overlay for the target. The predicted overlay may be an overlay that is predicted to be measured for the target by an ADI (Absolute Distance Interferometry) metrology tool. The predicted overlay for the target may be referred to as a predicted ADI overlay.

In the present embodiment, no effects from other layers are used to adjust the overlay value of stage 426 (there is no stage applied to the target that is analogous to stage 408 for the device). In other embodiments, the overlay of stage 426 may be adjusted to include effects of other layers. The overlay of stage 426 may be adjusted in dependence on factors other than pattern shift, for example in dependence on any of factors A to D above.

At stage 430, the processor subtracts the predicted decap overlay for the device obtained at stage 400 and the predicted ADI overlay for the target obtained at stage 420 to obtain a predicted offset for the target and the device. In other embodiments, the predicted offset may be obtained directly from the sensitivities, lens aberration or pattern shift. At stage 440, the processor outputs the predicted offset.

In some embodiments, the predicted offset is determined from sensitivities and aberration data without including some or all of the stages of FIG. 9. In some embodiments, additional stages are added to the process of FIG. 9.

The predicted offset may be used to manipulate scanner settings. The predicted offset may be used to apply or adjust an offset, for example by changing an offset value in the APC.

In some embodiments, a predicted offset from one exposure is used to adjust an offset applied in a further exposure. In some embodiments, a predicted offset from one wafer is used to adjust an offset applied when exposing a further wafer. The method of FIG. 9 may be applied within the lithographic apparatus for wafer-level control. In some embodiments, a predicted offset from a wafer from one lot is used to adjust an offset applied when exposing a further lot.

In further embodiments, any of pattern shift, overlay or offset may be predicted. A predicted pattern shift, overlay or offset may be used to adjust any suitable parameter in any subsequent layer, region or wafer.

In some embodiments, a predicted pattern shift, overlay or offset is used as a monitoring tool to flag a system when large changes are predicted.

Offsets between metrology devices and device features, for example offsets due to metrology targets and device features having different sensitivities to aberration, may be predicted using the method of FIG. 9. In the method of FIG. 9, pattern shift is determined for device features and metrology targets based on lens aberration data and aberration sensitivities, and is used to calculate overlay and offset.

In the method of FIG. 9, the aberrations used in the calculation of pattern shift are representative of the actual exposure conditions. Driver-lens model residuals are exported immediately after an exposure is complete and are stored until the time the computed offset is needed. Data for every layer that affects overlay is stored for later retrieval.

The predicted overlay for device features is used in combination with the predicted overlay for metrology targets to predict an offset between device features and metrology targets. By predicting an offset (for example, predicting an offset instead of relying solely on measured offsets), a measurement frequency may be reduced. For example, a frequency of measurement by CD-SEM may be reduced. In some circumstances, the frequency of measurement may be reduced to occasional spot checks and/or to measurement for verification purposes. In some circumstances, a change in predicted offset may be compensated without measuring the offset (for example, measuring the offset destructively using CD-SEM).

In some circumstances, the use of predicted offsets may allow a number of metrology targets to be reduced. For example, if only measurements (for example, CD-SEM measurements) are used to determine offsets, measurement locations may need to be located very close together in the exposure slits. If predicted offsets are used, offsets may be predicted at a higher density of locations than the actual density of metrology targets and/or measurement locations. In some cases, the proportion of space on the substrate that is used for metrology targets may be reduced.

In some embodiments, an APC correction is used that is based on predicted device overlay, rather than on metrology target overlay. In some embodiments, offsets are not considered. An offset may be considered to be accurate. Calculations may be performed with zero offset.

For example, in some embodiments:

$$\text{APC correction} = \text{APC model(predicted metrology target overlay)} + \text{offset}$$

If the offset is considered to be accurate then a method for determining the APC correction may be simplified to:

$$\text{APC correction} = \text{APC model(predicted metrology target overlay)}.$$

Figure 10:
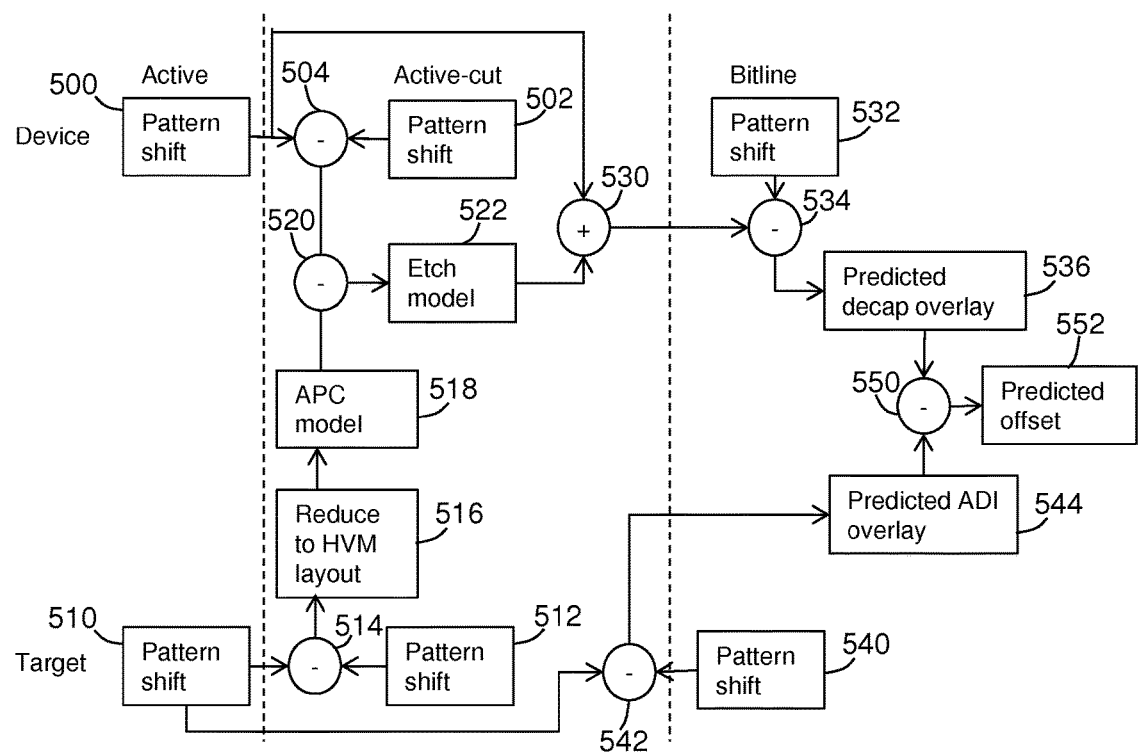
FIG. 10 schematically illustrates a more detailed view of an offset prediction process.

FIG. 10 is a flowchart representing a specific case of computational offset prediction for bitline-to-active in $6F^2$ DRAM. FIG. 10 is divided up into stages that pertain to an active layer (to the left of FIG. 10), stages that pertain to an active-cut layer (in the middle of FIG. 10), and stages that pertain to a bitline layer (to the right of FIG. 10). Stages pertaining to the different layers are divided by dashed lines. The central portion of FIG. 10, between the dashed lines, may be considered to correspond to stage 408 of FIG. 9.

At stage 500 of FIG. 10, the processor determines a pattern shift for a feature of the device on the active layer. The pattern shift is determined using lens aberration data for the exposure in which the feature is formed, and sensitivities obtained from imaging simulations.

At stage 502 of FIG. 10, the processor determines a pattern shift for an active-cut layer of the device. The pattern shift is representative of a pattern shift of a cut formed by a cut mask. The pattern shift is determined using lens aberration data for the exposure in which the cut mask is applied, and sensitivities obtained from imaging simulations.

At stage 504, the processor combines the pattern shift of the active cut layer and the pattern shift of the active layer of the device, for example by subtraction, to determine the overlay between the cut mask and active layer.

At stage 510, the processor determines a pattern shift for a feature of the target on the active layer. In the present embodiment, stage 510 uses the same lens aberration data as stage 500, and sensitivities are obtained from measured aberration data for the metrology target. At stage 512, the processor determines a pattern shift for an active-cut layer of the metrology target. Stage 512 uses the same lens aberration data as stage 502, and sensitivities are obtained from measured aberration data for the metrology target.

At stage 514, the processor subtracts the pattern shift of the active-cut layer of the target and the pattern shift of the active layer of the target, to determine the overlay between the cut mask and active layer.

At stage 516, the processor reduces the results of stage 514 to an HVM (high volume manufacturing) layout. In some embodiments, the pattern shift of stages 510 and 512 is determined at a higher density of locations than the density of targets in an HVM layout. In some embodiments, pattern shift is determined using lens aberration data that has been obtained for a large number of points. Results may be reduced to the HVM layout, for example, by interpolation. The layout may be reduced to the HVM layout so that overlay is modelled only on the locations that would be measured in production. By determining overlay for the HVM layout, the resulting APC model may be as close as possible to what would happen in the manufacturing process.

At stage 518, the processor generates a model based on the calculated overlay data from stage 516. The generation of the model may be to mimic a production process, which may apply a correction based on measured overlay. At stage 520, the processor subtracts the result of stage 504 (which in this embodiment is the overlay between the cut mask and the active layer) and the results of stage 518. The output of stage 520 may comprise an overlay on the device feature minus an APC model based on metrology target overlay.

At stage 522, the results of stage 520 are input into an etch model. The processor applies the etch model to the overlay that is output from stage 520, which may be a residual overlay after APC correction. The etch model simulates the effect of etching on features that are overlaid with an overlay according to stage 520.

At stage 530, the processor adds the output of the etch model of stage 522 to the pattern shift of the active layer (as determined at stage 500).

At stage 532, the processor determines a pattern shift for a feature of the device on the bitline layer. The processor determines the pattern shift based on lens aberration data for the bitline layer and sensitivities obtained from imaging simulations. At stage 534, the processor subtracts the output of stage 530 and the pattern shift of stage 532. At stage 536, the processor outputs a predicted decap overlay for the device. The predicted decap overlay is a bitline-to-active overlay.

At stage 540, the processor determines a pattern shift for a feature of the target on the bitline layer. At stage 542, the processor subtracts the pattern shift of the active layer of the target as determined at stage 510 and the pattern shift of the bitline layer of the target as determined at stage 540. At stage 544, the processor outputs a predicted ADI overlay for the target.

At stage 550, the processor subtracts the predicted decap overlay of the device and the predicted ADI overlay of the feature to predict an offset. At stage 552, the processor outputs the predicted offset.

The predicted offset may be used to apply or adjust an offset used for a subsequent exposure, for example for a subsequent wafer. The predicted offset may be used to apply or adjust an offset in the APC.

Figure 11:
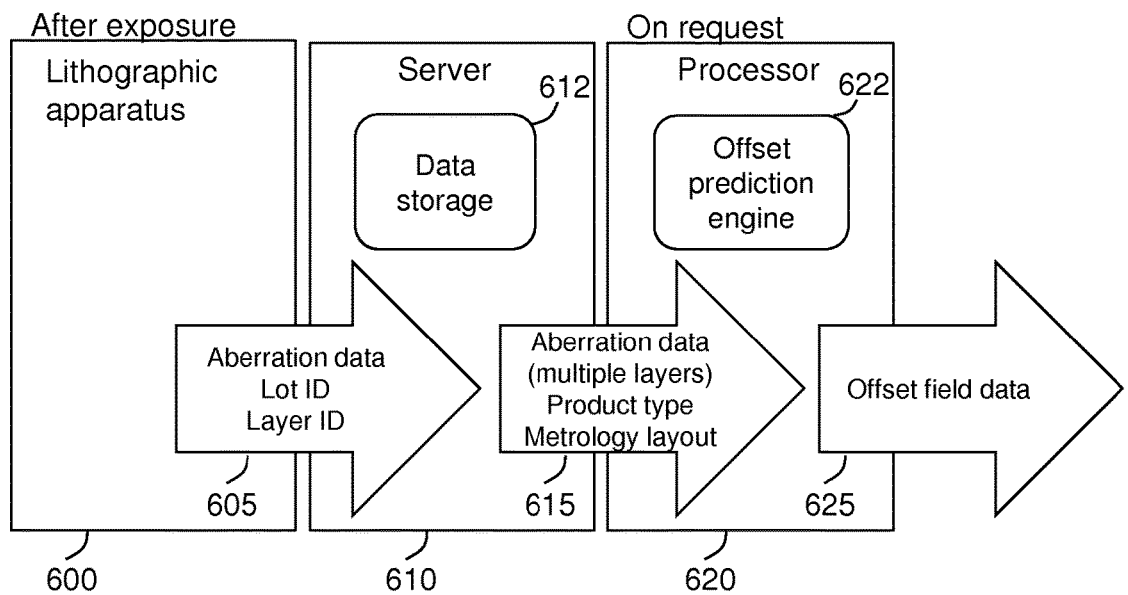
FIG. 11 schematically illustrates a general flow for offset prediction.

A general data flow of an embodiment is illustrated in FIG. 11. A system comprises a lithographic apparatus 600, server 610 and processor 620.

At stage 605, data is exported from the lithographic apparatus 600 to the server 610. The data exported from the lithographic apparatus comprises aberration data, lot ID data and layer ID data. In the present embodiment, for each wafer, residuals from a driver lens model are exported after exposure of each layer that affects device or target overlay (2 or more layers).

The exported residuals are stored in a database on the server 610. In some embodiments, the server 610 is located in the fab. The server 610 comprises data storage 612 in which the data exported at stage 605 is stored.

At stage 615, data is exported from the server 610 to the processor 620 for calculation of an offset. The data exported at stage 615 comprises aberration data for multiple layers (for example, for at least two layers), a product type and a metrology layout. The metrology layout may indicate the positions of metrology targets. The data may comprise wafer ID or some other way to match wafers. The wafer ID may be used to match wafers at different steps. For example, if a wafer is scrapped at some point, the system may need to know which aberration data belongs to which wafer at each step. In some embodiments, the data exported at stage 615 comprises geometry information and/or layer interaction information.

The processor 620 comprises an offset prediction engine 622 configured to perform the process of FIG. 9. The offset prediction engine calculates an offset based on the aberration data, product type and metrology layout. At stage 625, offset field data is output from the processor. The offset field data may be used to apply or adjust the value of a subsequent offset.

Using the method of any of FIGS. 9 to 11, an overlay caused by aberration on device features may in some circumstances be predicted based on an accurate description of device geometries, etching effects and/or interactions between all the layers involved. Device feature aberration sensitivities may be determined using imaging simulations.

An overlay caused by aberration on metrology targets may be predicted based on accurate aberration sensitivities, for example aberration sensitivities determined from a combination of imaging simulations and measured aberration sensitivities.

An offset calculation may be calculated based on actual exposure aberration data stored in a database. The actual exposure aberration data may be calculated using a driver lens model based on input from sensors and feedforward calculations, and may include contributions such as lot corrections, process corrections and lens heating.

The method of any of FIGS. 9 to 11 may be used for direct process control applications. The method of any of FIGS. 9 to 11 may be used for continuous monitoring of scanners and prevention of yield loss. The method of any of FIGS. 9 to 11 may be used for requalification of a scanner after maintenance. The requalification of a scanner may be quicker if it is not required to process wafers in order to measure device-to-metrology offsets.

Although the methods of FIGS. 9 to 11 have been described with reference to metrology targets, any suitable targets may be used. For example, the method of any of FIGS. 9 to 11 may be used to correct aberration effects on alignment marks. In some circumstances, when determining offset for alignment marks, different process effects may be considered than when determining offset for metrology targets.

While specific embodiments of the invention have been described above, it will be appreciated that the invention may be practiced otherwise than as described. The description is not intended to limit the invention.

The invention claimed is:

1. A method comprising:
    forming on a substrate a first target comprising a first feature and a second target comprising a second feature using a lithographic apparatus, wherein the forming of the first and second targets comprises:
        projecting a radiation beam through a production patterning device installed in the lithographic apparatus to create the first feature and the second feature, the first and second features corresponding to one or more patterning device features, and
        controlling a configuration of the lithographic apparatus to induce an aberration, such that the first feature is applied to the substrate using a first value of an induced aberration component and the second feature is applied to the substrate using a second, different value of the induced aberration component;
    measuring a property of the first and second targets; and
    using the measurements to determine a sensitivity of the property of the first and second targets to changes in value of the induced aberration component, wherein:
    the first and second features are applied to a first lithographic layer;
    the first target comprises a third feature applied to a second lithographic layer;
    the second target comprises a fourth feature applied to the second lithographic layer; and
    the third and fourth features are applied to the second lithographic layer substantially without the induced aberration component.

2. The method of claim 1, wherein the first target comprises a first metrology target, the second target comprises a second metrology target, and the one or more patterning device features comprise one or more production metrology markers.

3. The method of claim 1, wherein the first target comprises a first desired lithographic feature and the second target comprises a second desired lithographic feature.

4. The method of claim 1, wherein the production patterning device comprises a production reticle on which production metrology markers and patterning features are arranged to form a desired layout of metrology targets and desired lithographic features on a wafer in a production manufacturing process.

5. The method of claim 1, further comprising:
    forming further targets on the substrate, wherein features of the further targets are applied using first and second values of a second induced aberration component;
    measuring a property of the further targets; and
    determining a sensitivity of a property of the further targets to changes in the second induced aberration component using measurements of the further targets.

6. A method of claim 1, wherein the induced aberration component is a component represented by a selected Zernike coefficient.

7. The method of claim 1, wherein for a plurality of target portions of a single substrate, a different aberration component is induced for each of the target portions, thereby to determine sensitivity of the first and second targets to a plurality of different aberration components from the single substrate.

8. The method of claim 1, wherein the property of the targets comprises an overlay property.

9. The method of claim 1, wherein the controlling of the configuration of the lithographic apparatus comprises at least one of:
    moving or deforming one or more elements of a lens arrangement of the lithographic apparatus, or heating one or more portions of the lithographic apparatus; and
    locally changing an optical path length of the radiation beam using an array of optical elements arranged transverse to the radiation beam, each optical element comprising an individually addressable heating device.

10. The method of claim 1, further comprising at least one of:
    forming at least one reference target, wherein the at least one reference target is formed substantially without the induced aberration; and
    modifying a method of measuring the property of the first and second targets based on the determined sensitivity.

11. A lithographic apparatus comprising:
    an illumination system that provides a beam of radiation;
    a support structure that supports a production patterning device, wherein the production patterning device is configured to impart the radiation beam with a pattern in its cross-section;
    a projection system that projects the patterned radiation beam onto target portions of a substrate; and
    a processing resource;
    wherein the lithographic apparatus is configured to form on the substrate a first target comprising a first feature and a second target comprising a second feature, the forming of the first and second targets comprising:
        applying the first feature and the second feature to the substrate by projection of the radiation beam through the production patterning device, the first and second features corresponding to one or more patterning device features of the production patterning device, and
        controlling a configuration of the lithographic apparatus to induce an aberration,
        such that the first feature is applied to the substrate using a first value of an induced aberration component and the second feature is applied to the substrate using a second, different value of the induced aberration component,
    wherein the processing resource is configured to use measurements of a property of the first target and of the second target to determine a sensitivity of the property of the first and second targets to changes in value of the induced aberration component; and wherein:

the first and second features are applied to a first lithographic layer;

the first target comprises a third feature applied to a second lithographic layer;

the second target comprises a fourth feature applied to the second lithographic layer; and the third and fourth features are applied to the second lithographic layer substantially without the induced aberration component.

12. A method comprising:

forming a target on a substrate using a lithographic apparatus;

performing at least one measurement to determine a value of an aberration that is present during the forming of the target;

obtaining a sensitivity of a property of the target to the aberration;

predicting a value of the property of the target in dependence on the at least one measurement and on the sensitivity, wherein the property comprises at least one of pattern shift and overlay; and using the predicted value of the property to adjust the property in forming a subsequent target.

13. The method according to claim 12, wherein the obtaining of the sensitivity of the property of the target comprises performing a method comprising:

forming on the substrate a first target comprising a first feature and a second target comprising a second feature using the lithographic apparatus, wherein the forming of the first and second targets comprises:

projecting a radiation beam through a production patterning device installed in the lithographic apparatus to create the first feature and the second feature, the first and second features corresponding to one or more patterning device features, and controlling a configuration of the lithographic apparatus to induce an aberration, such that the first feature is applied to the substrate using a first value of an induced aberration component and the second feature is applied to the substrate using a second, different value of the induced aberration component;

measuring a property of the first and second targets; and using the measurements to determine a sensitivity of the property of the first and second targets to changes in value of the induced aberration component.

14. A lithographic apparatus comprising:

an illumination system that provides a radiation beam;

a support structure that supports a production patterning device, the production patterning device configured to impart the radiation beam with a pattern in its cross-section;

a projection system that projects the patterned radiation beam onto target portions of a substrate; and a processing resource configured to control operation of the lithographic apparatus to:

form at least one of a target or device on the substrate;

perform at least one measurement to determine a value of an aberration that is present during the forming of the target or device;

obtain a sensitivity of a property of the target or device to the aberration;

predict a value of the property of the target or device in dependence on the at least one measurement and on the sensitivity; and use the predicted value of the property to adjust the property in forming a subsequent target or device.

* * * * *